United States Patent
Sundaresan et al.

(10) Patent No.: US 12,369,368 B2
(45) Date of Patent: Jul. 22, 2025

(54) SEMICONDUCTOR SWITCHING DEVICE

(71) Applicant: GeneSiC Semiconductor Inc., Dulles, VA (US)

(72) Inventors: Siddarth Sundaresan, Dulles, VA (US); Jaehoon Park, Dulles, VA (US)

(73) Assignee: GeneSiC Semiconductor Inc., Dulles, VA (US)

(*) Notice: Subject to any disclaimer, the term of this patent is extended or adjusted under 35 U.S.C. 154(b) by 0 days.

(21) Appl. No.: 18/466,227

(22) Filed: Sep. 13, 2023

(65) Prior Publication Data
US 2025/0089315 A1    Mar. 13, 2025

(51) Int. Cl.
*H10D 62/10*    (2025.01)
*H10D 30/63*    (2025.01)
*H10D 62/832*   (2025.01)

(52) U.S. Cl.
CPC ........... *H10D 62/126* (2025.01); *H10D 30/63* (2025.01); *H10D 62/8325* (2025.01)

(58) Field of Classification Search
CPC ............. H01L 29/0692; H01L 29/1608; H01L 29/7827; H10D 30/63; H10D 62/126; H10D 62/8325
USPC ....................................................... 257/288
See application file for complete search history.

(56) References Cited

U.S. PATENT DOCUMENTS

| | | | |
|---|---|---|---|
| 6,940,110 B2 * | 9/2005 | Takahashi | H01L 29/0623 257/E29.256 |
| 7,534,683 B2 | 5/2009 | Shenoy et al. | |
| 10,763,356 B1 * | 9/2020 | Sundaresan | H01L 29/7813 |
| 10,937,870 B2 | 3/2021 | Bolotnikov et al. | |
| 11,056,586 B2 | 7/2021 | Arthur et al. | |
| 11,527,615 B2 * | 12/2022 | Suto | H01L 29/7806 |
| 11,804,520 B2 * | 10/2023 | Nakano | H01L 29/1095 |
| 2013/0306983 A1 * | 11/2013 | Nakano | H01L 29/7813 438/270 |
| 2016/0308003 A1 * | 10/2016 | Hirakata | H01L 29/1608 |
| 2017/0338314 A1 * | 11/2017 | Bolotnikov | H01L 29/7816 |
| 2018/0182889 A1 * | 6/2018 | Takaya | H01L 29/66068 |
| 2018/0337227 A1 * | 11/2018 | Nakano | H01L 29/1037 |
| 2019/0198663 A1 * | 6/2019 | Sakai | H01L 29/66068 |
| 2021/0134960 A1 * | 5/2021 | Siemieniec | H01L 29/0688 |

* cited by examiner

*Primary Examiner* — Igwe U Anya
(74) *Attorney, Agent, or Firm* — Raj S. Dave; Davé Law Group, LLC

(57) ABSTRACT

A device having reduced Rds(on) is described. The device comprises a unit cell. The unit cell comprises: a first region, a second region, a third region, and a fourth region. The fourth region is residing on the first region, the second region, and the third region. The second region connects the first region and the third region. The first region, the second region and the third region are of same conductivity type (e.g., second conductivity type). In an embodiment, the fourth region comprises a fifth region and a sixth region. The fourth region, the fifth region, and the sixth region are of same conductivity type (e.g., first conductivity type). The fourth region is on the first region. The fifth region is on the second region. The sixth region is on the third region. In an embodiment, the device achieves reduced Rds(on) by relaxing the JFET constraint.

17 Claims, 33 Drawing Sheets

SEMICONDUCTOR SWITCHING DEVICE

FIELD OF THE INVENTION

The present disclosure relates to power semiconductor devices. More particularly, the present disclosure relates to a semiconductor switching device having reduced Rds(on) under the conduction mode of operation and low leakage current under the blocking mode of operation.

BACKGROUND

Silicon based power devices have long dominated power electronics and power system applications. On the other hand, silicon carbide (SiC) is a wider band-gap (Eg) material with Eg=3.3 eV as compared to silicon (Eg=1.1 eV) and hence, SiC has a higher blocking voltage than Silicon (Si). SiC has a higher breakdown electric field ($3\times10^6$ V/cm to $5\times10^6$ V/cm) compared to silicon (Si) (breakdown electric field for Si is $0.3\times10^6$ V/cm) and is a better thermal conductor (3.7 (W/cm-K) for SiC versus 1.6 (W/cm-K) for Si). SiC has been a material of choice for power MOSFETs. However, "[e]ven with the successful introduction of SiC power MOSFETs into the commercial marketplace, several key reliability issues have not been fully resolved." [source: Key Reliability Issues for SiC Power MOSFETs, A. Lelis, D. Habersat, R. Green, and E. Mooro of the U.S. Army Research Laboratory, published in ECS Transactions, 58 (4) 87-93 (2013), DOI: 10.1149/05804.0087ecst].

"[W]hile SiC power MOSFETs share many similarities to silicon MOSFETs, many challenging differences remain. In particular, the wide-bandgap nature of 4H-SiC (EG=3.26 eV) is both a blessing and a curse, bringing a low intrinsic carrier concentration and a high critical electric field, while presenting challenges with inversion-layer mobility and reliability in passivating dielectric layers." [Source: Challenges in SiC Power MOSFET Design by Kevin Matocha of the GE Global Research Center—Semiconductor Technology Laboratory, Niskayuna, NY USA, published in ISDRS 2007, Dec. 12-14, 2007, College Park, MD, USA].

"[A] silicon carbide (SiC) device may include a gate electrode disposed above a SiC semiconductor layer, wherein the SiC semiconductor layer comprises: a drift region having a first conductivity type; a well region disposed adjacent to the drift region, wherein the well region has a second conductivity type; and a source region having the first conductivity type disposed adjacent to the well region, wherein the source region comprises a source contact region and a pinch region, wherein the pinch region is disposed only partially below the gate electrode, wherein a sheet doping density in the pinch region is less than $2.5\times10^{14}$ cm$^{-2}$, and wherein the pinch region is configured to deplete at a current density greater than a nominal current density of the SiC device to increase the resistance of the source region." [source: Silicon carbide device and method of making thereof, Peter Almem Losee, Ljubisa Dragoljub Stevanovic, Gregory Thomas Dunne, Alexander Viktorovich Bolotnikov, published as U.S. Pat. No. 9,899,512B2 on Feb. 20, 2018].

"In power switching supplies, one of the primary contributors for power losses are power transistors. Transistor losses stem from two main categories: conduction losses and switching losses. Conduction losses refer to losses caused by current flow when the power transistor is turned on. Switching losses refer to losses that occur when the transistor is in the process of turning on and off.

Conduction Losses: Similar to Silicon transistors, when turned on, GaN transistors resemble a resistance that is between drain and source. This resistance is often referred to as Rds(on) or Ron. Conduction losses are proportional to this resistance. When it comes to the relationship between breakdown voltage and Rds(on), GaN provides a huge advantage over other materials. For a given breakdown voltage, the Rds(on) value of GaN devices is the lowest compared to that of Silicon and Silicon Carbide devices. By having lower Rds(on) values than other materials, our conduction losses are also lower." [Source: How GaN Enables More Efficient and Reduced Form Factor Power Supplies; Hagar Mohamed; August 2022]

Therefore, there is a long-felt need for SiC power devices having reduced Rds(on).

SUMMARY

The following presents a summary to provide a basic understanding of one or more embodiments described herein. This summary is not intended to identify key or critical elements or delineate any scope of the different embodiments and/or any scope of the claims. The sole purpose of the summary is to present some concepts in a simplified form as a prelude to the more detailed description presented herein.

In one or more embodiments described herein, systems, devices, and methods are presented. Disclosed are one or more aspects of a semiconductor switching device having lower on-state conduction.

In an aspect, a device is described. The device comprises a semiconductor unit cell. The semiconductor unit cell comprises one or more semiconductor regions that are spatially arranged as: a first region, a second region, a third region, and a fourth region. The fourth region is residing on the first region, the second region and the third region. In an embodiment, the second region connects the first region and the third region. In another embodiment, the first region, the second region and the third region are of same conductivity type.

In an embodiment, the second region connects the first region and the third region with a periodicity at a fixed interval space.

In another embodiment, the device comprises a seventh region that is surrounded by the first region, the second region and the third region. The seventh region and the fourth region are of same conductivity type.

In another embodiment, the device further comprises a Metal-Insulator-Semiconductor (MIS) channel region. The MIS channel region may be located on the first region. The one or more semiconductor regions comprises silicon carbide.

In another embodiment, the MIS channel region is located on the second region.

In another embodiment, the MIS channel region is located on the third region.

In another embodiment, the MIS channel region is between the fourth region and a seventh region.

In another embodiment, the first region, the second region, and the third region are of a second conductivity type.

In another embodiment, the fourth region and the seventh region are of a first conductivity type.

In another embodiment, the second conductivity type is p-type.

In another embodiment, the first conductivity type is n-type.

In another embodiment, the second region connects the first region and the third region with a periodicity at an irregular interval space.

In another embodiment, the semiconductor unit cell further comprises: a drift region; a substrate region; a gate insulator region; a gate electrode region; an interlayer dielectric region; a source metal region; and a drain metal region.

In another embodiment, the first region comprises a first body region.

In another embodiment, the second region comprises a second body region.

In another embodiment, the third region comprises a third body region.

In another embodiment, the fourth region comprises a source region.

In another embodiment, the first region comprises a first contact region.

In another embodiment, a depth of the fourth region is shallow in vicinity of the second region.

In another embodiment, a depth of the fourth region is shallow in vicinity of the third region.

In another embodiment, the first contact region comprises a first silicide region.

In another embodiment, a first end of the second region is contiguous with the first region and a second end of the second region is contiguous with the third region.

In another embodiment, the first region, the second region, and the third region are of a first conductivity type.

In another embodiment, the fourth region comprises a fifth region; and a sixth region. The fourth region, the fifth region, and the sixth region are of same conductivity type.

In another embodiment, the fourth region, the fifth region, and the sixth region are of a first conductivity type.

In another embodiment, the fourth region is on the first region.

In another embodiment, the fifth region is on the second region.

In another embodiment, the sixth region is on the third region.

In another embodiment, the device further comprises: an eighth region.

In another embodiment, the eighth region is of a second conductivity type.

In another embodiment, the eighth region is an excessively doped region.

In another embodiment, the device further comprises a second contact region. The second contact region is formed on the sixth region.

In another embodiment, the second contact region comprises a second silicide region.

In another embodiment, the fifth region comprises a source region.

In another embodiment, the sixth region comprises a source region.

In another embodiment, the fifth region is shallower than the fourth region.

In another embodiment, the sixth region is shallower than the fourth region.

In another embodiment, the seventh region comprises a seventh region center.

In another embodiment, the seventh region comprises a plurality of depletion paths that extends from a plurality of directions from the first region, the second region, and the third region.

In another embodiment, the seventh region comprises a first dimension and a second dimension.

In another embodiment, a ratio of the first dimension to the second dimension can vary from 0.3 to 2.0.

In another aspect, a device is described. The device comprises a semiconductor unit cell. The semiconductor unit cell comprises a first region, a second region, a third region, a gate insulator region, and a fourth region residing on the first region, and the third region. In an embodiment, the second region connects the first region and the third region. In an embodiment, the first region, the second region, and the third region are of same conductivity type. In an embodiment, the second region is not in contact with the gate insulator region.

In an embodiment, the second region comprises laterally straggled ions from the first region and the third region.

In an embodiment, the device further comprises a seventh region that surrounds the first region and the third region. In an embodiment, the seventh region and the fourth region are of same conductivity type.

In an embodiment, the second region connects the first region and the third region with a periodicity at a fixed interval space.

In an embodiment, the device further comprises: a Metal-Insulator-Semiconductor (MIS) channel region, wherein the MIS channel region is located on the first region. The one or more semiconductor regions comprises silicon carbide.

In an embodiment, the MIS channel region is located on the third region.

In an embodiment, the MIS channel region is between the fourth region and a seventh region.

In an embodiment, the first region, the second region, and the third region are of a second conductivity type.

In an embodiment, the fourth region and the fifth region are of a first conductivity type.

In an embodiment, the second conductivity type is p-type.

In an embodiment, the first conductivity type is n-type.

In an embodiment, the second region connects the first region and the third region with a periodicity at an irregular interval space.

In an embodiment, the semiconductor unit cell further comprises: a drift region; a substrate region; a gate insulator region; a gate electrode region; an interlayer dielectric region; a source metal region; and a drain metal region.

In an embodiment, the first region comprises a first body region.

In an embodiment, the second region comprises a second body region.

In an embodiment, the third region comprises a third body region.

In an embodiment, the fourth region comprises a source region.

In an embodiment, the first region comprises a first contact region.

In an embodiment, the fourth region comprises a second contact region.

In an embodiment, a first end of the second region is contiguous with the first region and a second end of the second region is contiguous with the third region.

In an embodiment, the fourth region comprises: a sixth region. The fourth region, and the sixth region are of same conductivity type.

In an embodiment, the fourth region, and the sixth region are of a first conductivity type.

In an embodiment, the fourth region is on the first region.

In an embodiment, the sixth region is on the third region.

In an embodiment, the device further comprises: an eighth region; a trench region; a silicide region; and a VIA region.

In an embodiment, the eighth region is of a second conductivity type.

In an embodiment, the eighth region is located below the trench region.

In an aspect, a device is described. The device comprises a semiconductor unit cell. The semiconductor unit cell comprises one or more semiconductor regions that are spatially arranged as: a first region, a second region, a third region, and a fourth region residing on the first region, and the third region. The second region connects the first region and the third region. The first region, the second region and the third region are of same conductivity type.

In an embodiment, the second region connects the first region and the third region with a periodicity at a fixed interval space.

In an embodiment, the device further comprises: a seventh region that is surrounded by the first region, the second region and the third region. The seventh region and the fourth region are of same conductivity type.

In an embodiment, the device further comprises: a Metal-Insulator-Semiconductor (MIS) channel region. The MIS channel region is located on at least one of the first region, the second region, and the third region. The one or more semiconductor regions comprises silicon carbide.

In an embodiment, the first region, the second region, and the third region are of a second conductivity type.

In an embodiment, the fourth region and the seventh region are of a first conductivity type.

In an embodiment, the fourth region comprises: a fifth region; and a sixth region. The fourth region, the fifth region, and the sixth region are of same conductivity type.

In an embodiment, the fourth region, the fifth region, and the sixth region are of a first conductivity type.

In an embodiment, the fourth region is on the first region.

In an embodiment, the fifth region is on the second region.

In an embodiment, the sixth region is on the third region.

In an embodiment, the device further comprises: an eighth region. The eighth region is of a second conductivity type.

In an embodiment, the device further comprises: a second contact region. The second contact region is formed on the sixth region.

In an embodiment, the fifth region and the sixth region are shallower than the fourth region.

In an embodiment, the seventh region comprises a plurality of depletion paths that extends inwards from a plurality of directions from the first region, the second region, and the third region towards a center of the seventh region.

In an embodiment, the seventh region comprises a first dimension and a second dimension, wherein a ratio of the first dimension to the second dimension is in a range from 0.3 to 2.0.

In an embodiment, the device further comprises: a gate insulator region. The second region is not in contact with the gate insulator region.

In an embodiment, the second region comprises laterally straggled ions from the first region and the third region.

In an embodiment, the device further comprises an eighth region located below a trench region.

In an embodiment, the fourth region is also residing on the second region.

The methods and systems disclosed herein may be implemented in any means for achieving various aspects. Other features will be apparent from the accompanying drawings and from the detailed description that follows.

BRIEF DESCRIPTION OF THE FIGURES

The embodiments are illustrated by way of example and not limitation in the figures of the accompanying drawings, in which like references indicate similar elements and in which.

Figure 1:
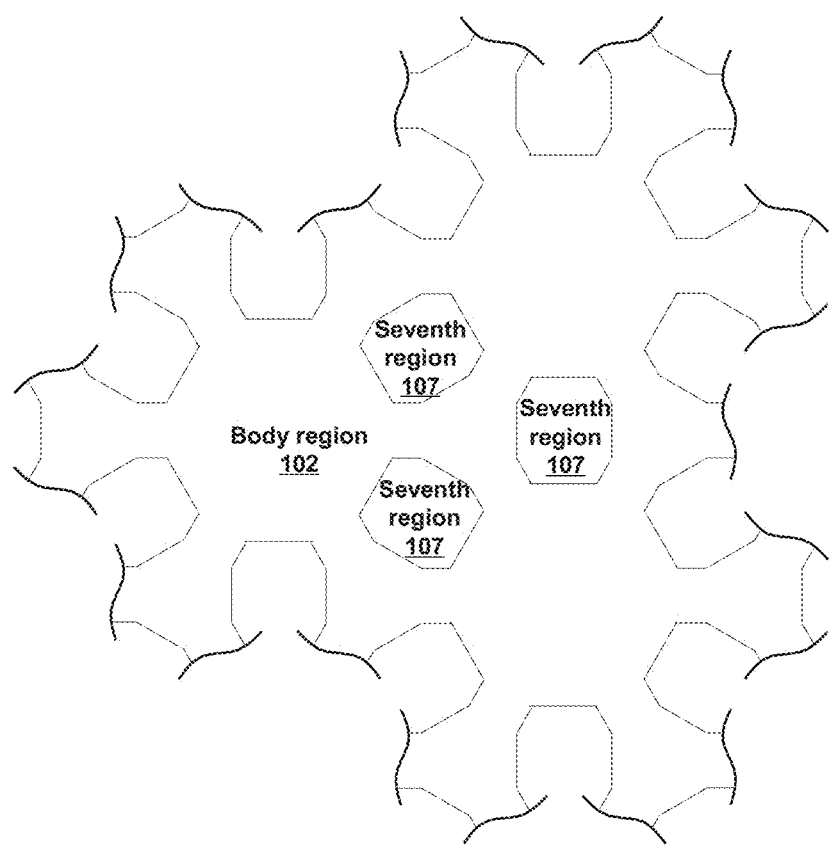
FIG. 1 illustrates a top-down view of a device having a body region as a single entity, according to one or more embodiments.

Other features of the present embodiments will be apparent from the accompanying drawings and from the detailed description that follows.

DETAILED DESCRIPTION

Definitions and General Techniques

Unless otherwise defined herein, scientific and technical terms used herein shall have the meanings that are commonly understood by those of ordinary skill in the art. Further, unless otherwise required by context, singular terms shall include pluralities and plural terms shall include the singular. Generally, nomenclatures used in connection with, and techniques of, semiconductor processing described herein are those well-known and commonly used in the art.

The methods and techniques described herein are generally performed according to conventional methods well known in the art and as described in various general and more specific references that are cited and discussed throughout the present specification unless otherwise indicated. The nomenclatures used in connection with, and the procedures and techniques of, semiconductor device technology and semiconductor processing, and other related fields described herein are those well-known and commonly used in the art.

For simplicity and clarity of illustration, the drawing figures illustrate the general manner of construction, and descriptions and details of well-known features and techniques may be omitted to avoid unnecessarily obscuring the present disclosure. Additionally, elements in the drawing figures are not necessarily drawn to scale. For example, the dimensions of some of the elements in the figures may be exaggerated relative to other elements to help improve understanding of embodiments of the present disclosure. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Furthermore, the terms "include," and "have," and any variations thereof, are intended to cover a non-exclusive inclusion, such that a process, method, system, article, device, or apparatus that comprises a list of elements is not necessarily limited to those elements, but may include other elements not expressly listed or inherent to such process, method, system, article, device, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the apparatus, methods, and/or articles of manufacture described herein are, for example, capable of operation in other orientations than those illustrated or otherwise described herein.

The following terms and phrases, unless otherwise indicated, shall be understood to have the following meanings.

The term "unit cell" or "semiconductor unit cell" as used herein refers to a piece of a pattern in a semiconductor which is repeated in the semiconductor.

The term "first region" as used herein refers to a first portion of the body region. The body region may be of second conductivity type (e.g., p-type). The first region comprises a first body region. The first region constitutes the core portion of the body region.

The term "second region" as used herein refers to a second portion of the body region. The body region may be of second conductivity type (e.g., p-type). The second region comprises a second body region. The second region constitutes the portion that connects the first region and the third region of the body region.

The term "third region" as used herein refers to a third portion of the body region. The body region may be of second conductivity type (e.g., p-type). The third region comprises a third body region.

The term "fourth region" as used herein refers to a source region. The source region may be of first conductivity type (e.g., n-type). The fourth region may be a single entity and may be laid on the first region, the second region, and the third region. In an embodiment, the fourth region may not be a single entity, i.e., the fourth region comprises a fifth region and a sixth region. In this case, the fourth region is on the first region, the fifth region is on the second region, and the sixth region is on the third region.

The term "fifth region" as used herein refers to a portion of the source region. The fifth region may be of first conductivity type (e.g., n-type). The fifth region is formed on the second region.

The term "sixth region" as used herein refers to a portion of the source region. The sixth region may be of first conductivity type (e.g., n-type). The sixth region is formed on the third region.

The term "seventh region" as used herein refers to a portion between the successive body regions of the unit cells. The seventh region may be of first conductivity type (e.g., n-type). The seventh region is surrounded by the first region, the second region, and the third region.

The term "eighth region" as used herein refers to a region which is formed at the center of the first body region. The eighth region may be of second conductivity type (e.g., p-type). The eighth region comprises a p-plus region. The eighth region may be an excessively doped second conductivity type region.

The term "periodicity" as used herein refers to a tendency to occur at intervals. Periodicity means that if elements are arranged in an order, the properties of elements would repeat after some period. Periodicity may also refer to an event or series of events to happen repeatedly in a fixed pattern. In an embodiment, the periodicity may also refer to an event or series of events to happen repeatedly in an irregular pattern.

The term "fixed interval" as used herein refers to a constant or equal amount of space or time between the occurrences of arrangement of elements.

The term "irregular interval" as used herein refers to a variable space or time between the occurrences of arrangement of elements. In this case, the arrangement of elements may be arranged with different spaces.

The term "SiC" as used herein refers to silicon carbide which is a compound semiconductor and is a mixture of silicon and carbon with the chemical formula SiC. Silicon is covalently bonded with carbon. In 4H-SiC, 4H is written in the Ramsdell classification scheme where the number indicates the layer, and the letter indicates the Bravais lattice. That means in a 4H-SiC structure four hexagonal layers of SiC are present. SiC exists in a kind of polymorphic crystalline building known as a polytype, e.g., 3C-SiC, 4H-SiC, 6H-SiC. Presently 4H-SiC is used in power device manufacturing.

The term "substrate" as used herein refers to the supporting material on or in which the components of an integrated circuit are fabricated or attached.

The term "JFET" as used herein refers to junction gate field-effect transistor which is a three-terminal semiconductor device that can be used as electronically-controlled switches, amplifiers, or voltage-controlled resistors. A FET (field-effect transistor) is a unipolar transistor in which current carriers are injected at a source terminal and pass to a drain terminal through a channel of semiconductor material whose conductivity depends largely on an electric field applied to the semiconductor from a control electrode. There are two main types of FETs, a junction FET and an insulated-gate FET. In the junction FET, the gate is isolated from the channel by a p-n junction. In an insulated-gate FET, the gate is isolated from the channel by an insulating layer so that the gate and channel form a capacitor with the insulating layer as the capacitor dielectric.

The term "MOSFET" as used herein refers to a metal oxide semiconductor field-effect transistor. which is a four-terminal device with source (S), gate (G), drain (D) and body (B) terminals. The body of the MOSFET is frequently connected to the source terminal making it a three-terminal device like field effect transistor.

The term "DMOSFET" as used herein refers to double-implantation metal oxide semiconductor field-effect transistor. A common physical structure of SiC MOSFETs is the planar double-implanted MOSFET in 4H-SiC (SiC-DMOSFET).

The term "dopant" as used herein refers to an impurity added from an external source to a material by diffusion, coating, or implanting into a substrate, and changing the properties thereof. In semiconductor technology, an impurity may be added to a semiconductor to modify its electrical properties or to a material to produce a semiconductor having desired electrical properties. N-type (negative) dopants (e.g., such as nitrogen for a group IV semiconductor) typically come from group V of the periodic table. When added to a semiconductor, n-type dopants create a material that contains conduction electrons. P-type (positive) dopants (e.g., such as aluminum for a group IV semiconductor) typically come from group III of the periodic table and result in conduction holes (i.e., vacancies in the electron shells).

The term "drain" as used herein refers to the electrode of a field effect transistor which receives charge carriers which pass through the transistor channel from the source electrode.

The term "source" as used herein refers to the active region/electrode to which the source of charge carriers is connected in a field effect transistor.

The term "gate" as used herein refers to the control electrode or control region that exerts an effect on a semiconductor region directly associated therewith, such that the conductivity characteristic of the semiconductor region is altered in a temporary manner, often resulting in an on-off type switching action. The control electrode or control region of a field effect transistor is located between the source and drain electrodes, and regions thereof.

The term "impurity" as used herein refers to a foreign material present in a semiconductor crystal, such as aluminum or nitrogen in silicon carbide, which is added to the semiconductor to produce either p-type or n-type semiconductor region, or to otherwise result in material whose electrical characteristics depend on the impurity dopant atoms.

The term "p-n junction" as used herein refers to the interface and region of transition between two semiconductor region types (p-type and n-type) within a semiconductor.

The term "polysilicon" as used herein refers to a polycrystalline form of silicon.

The term "p-type" as used herein refers to a semiconductor in which the hole carrier density exceeds the electron carrier density.

The term "n-type" as used herein refers to a semiconductor in which the electron carrier density exceeds the hole carrier density.

The term "plus" used herein refers to certain regions in a metal-oxide-semiconductor (MOS) transistor where doping concentration is excessive.

The term "p-plus" used herein refers to an excessively doped p-type region.

The term "sinker" as used herein refers to deep implanted regions at key locations within the MOSFET structure.

The term "trench" as used herein refers to electrical isolation of electronic components in a monolithic integrated circuit by the use of grooves or other indentations in the surface of the substrate, which may or may not be filled with electrically insulative (i.e., dielectric) material.

The term "bandgap" as used herein refers to the difference between the energy levels of electrons bound to their nuclei (valence electrons) and the energy levels that allow electrons to migrate freely (conduction electrons). The band gap depends on the particular semiconductor involved.

The term "MIS channel region" as used herein refers to a region between an edge of the source region and an edge of the body region, being covered with gate electrode region. The MIS channel region refers to a Metal-Insulator-Semiconductor (MIS) channel region. The MIS channel region may be located into the first region, the second region, and the third region of the body region.

The term "chip" as used herein refers to a single crystal substrate of semiconductor region on which one or more active or passive solid-state electronic devices are formed. A chip may contain an integrated circuit. A chip is not normally ready for use until packaged and provided with external connectors.

The term "contact" as used herein refers to the point or part of a conductor which touches another electrical conductor or electrical component to carry electrical current to or from the conductor or electrical component.

The term "drift layer" or "drift region" as used herein refers to lightly doped region to support the high voltage in power DMOSFET.

The term "well" used herein refers to certain regions in a metal-oxide-semiconductor (MOS) transistor. MOS transistors are always created in a "well" region. A PMOS (positive-channel MOS) transistor is made in an N-doped region, called "n-well" region. Similarly, an NMOS transistor (negative-channel MOS) is made in a "p-type" region called "p-well". This ensures that the leakage between two transistors, through the bottom side, is low due to the reverse bias between the transistor areas and the well region.

The term "body region" used herein refers to certain regions in a metal-oxide-semiconductor (MOS) transistor. The body region comprises three subregions which comprises a first body region, a second body region, and a third body. The three subregions are of same conductivity type. For example, the three subregions are of second conductivity type (e.g., p-type).

The term "source interconnect metallization" as used herein refers to interconnection metallization that interconnects many DMOSFETs using fine-line metal patterns.

The term "device" as used herein refers to the physical realization of an individual electrical element in a physically independent body which cannot be further divided without destroying its stated function.

The term "surface" as used herein refers to the outer or exterior boundary.

The term "dielectric" as used herein refers to a non-conductor of electricity, otherwise known as an insulator.

The term "ILD" as used herein refers to interlayer dielectric material used to electrically separate closely spaced interconnect lines arranged in several levels (multilevel metallization) in an advanced integrated circuit.

The term "source metal region" as used herein refers to a region that provides a source terminal. The source metal region is at the first side of the MOSFET device providing a source terminal at first end.

The term "drain metal region" as used herein refers to a region that provides a drain terminal. The drain metal region is at the second side of the MOSFET device providing a drain terminal at second end.

The term "gate insulator region" as used herein refers to a gate oxide region. The gate insulator region provides insulation between the gate electrode and the source region, the body region, and the drift region.

The term "gate electrode region" as used herein refers to a region that sits on top of the gate oxide region. The gate electrode region regulates the current inside the transistor channel. The gate electrode region controls the flow of electrical current between the source and the drain.

The term "VIA region" as used herein refers to a connection between overlapping geometries on different layers.

The term "silicide region" as used herein refers to a region that makes an ohmic contact to either the body region and/or the source region.

The term "laterally straggled ions" refers to ions from the first region and the third region merged or combined to form a sub-surface region of the second conductivity type.

The term "active region" as used herein refers to a region of the DMOSFET where the current conduction happens.

The terms "first conductivity type region" and "second conductivity type region" as used herein, are used to describe n-type and p-type regions respectively for a N type device. For a P type device "first conductivity type region" and "second conductivity type region" are used to describe p-type and n-type regions respectively.

Embodiments related to silicon carbide (SiC) power MOSFET devices have lower on-state conduction with improved leakage current under the off-state mode of operation.

An embodiment relates to silicon carbide (SiC) power MOSFET devices that contribute to carrier conduction path.

An embodiment relates to silicon carbide (SiC) power MOSFET devices having decreased conduction loss during the on-state mode of operation.

An embodiment relates to silicon carbide (SiC) power MOSFET devices having decreased leakage current during the off-state mode of operation.

FIG. 1 illustrates a top-down view of a device having a body region 102 as a single entity, according to one or more embodiments. The device shown in FIG. 1 comprises a metal-oxide-semiconductor field-effect transistor (MOSFET). The body region 102 shown in FIG. 1 as a single entity which is undivided. The MOSFET comprises one or more body regions 102 within a unit cell. The MOSFET may also comprise one or more unit cells. The region between the body regions 102 is referred to as seventh region 107. In an embodiment, the seventh region is a junction gate field-effect transistor (JFET) region.

Figure 2:
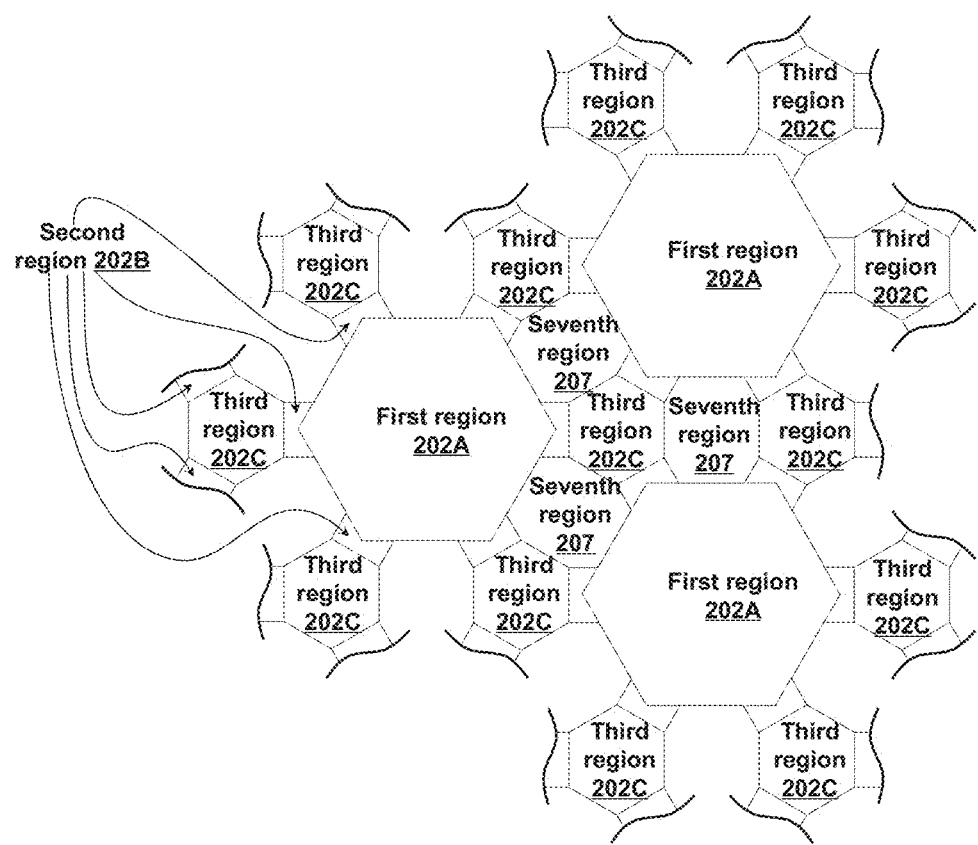
FIG. 2 illustrates a top-down view of a device having a body region divided into subregions, according to one or more embodiments.

In an aspect, a device is described. FIG. 2 illustrates a top-down view of a device having a body region 202 divided into subregions, according to one or more embodiments. The device comprises a unit cell. The unit cell comprises one or more semiconductor regions that are spatially arranged as: a first region 202A, a second region 202B, a third region 202C, and a fourth region (not shown in FIG. 2). The first region 202A, the second region 202B, and the third region 202C are the subregions that constitute the body region 202. The body region 202 comprises the first region 202A, the second region 202B, and the third region 202C that repeats with a periodicity. The body region 202 is shown in FIG. 2 as multiple entities as the first region 202A, the second region 202B, and the third region 202C. In an embodiment, the first region 202A comprises a first body region. The second region 202B comprises a second body region. The third region 202C comprises a third body region. The one or more semiconductor regions comprises silicon carbide.

The fourth region is residing on the first region 202A, and the second region 202B and the third region 202C. In an embodiment, the second region 202B connects the first region 202A and the third region 202C. In another embodiment, the first region 202A, the second region 202B and the third region 202C are of same conductivity type. In an embodiment, the second region 202B connects the first region 202A and the third region 202C. In another embodiment, a first end of the second region is contiguous with the first region and a second end of the second region is contiguous with the third region. In an embodiment, the second region 202B connects the first region 202A and the third region 202C with the periodicity at a fixed interval space. In another embodiment, the second region 202B connects the first region 202A and the third region 202C with the periodicity at an irregular interval space. In another embodiment, the first region 202A, the second region 202B, and the third region 202C are of a second conductivity type for an n-type device. The second conductivity type is p-type. In another embodiment, the first region 202A, the second region 202B, and the third region 202C are of a first conductivity type for a p-type device. The first conductivity type is n-type.

In one embodiment, the device comprises a seventh region 207 that is surrounded by the first region 202A, the second region 202B and the third region 202C. The pitch of the unit cell is shrunk (e.g., narrow, short) when compared to the conventional devices. The pitch of the unit cell makes the seventh region have shorter dimensions. The seventh region comprises a first dimension and a second dimension in a ratio that can vary from 0.3 to 2.0. The seventh region 207 and the fourth region (not shown in FIG. 2) are of same conductivity type. The fourth region comprises a source region. In another embodiment, the fourth region and the seventh region 207 are of a first conductivity type. In another embodiment, the first conductivity type is n-type.

Figure 3A:
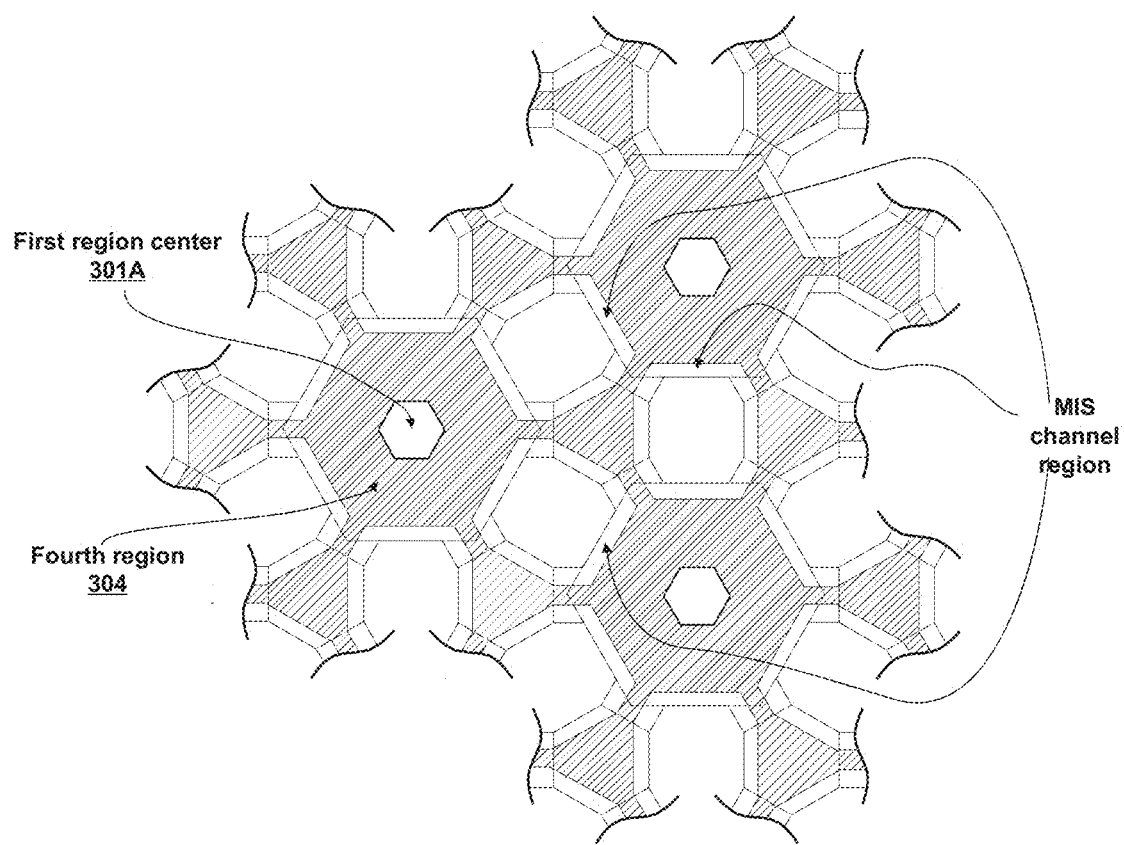
FIG. 3a illustrates a top-down view of a device having a single region laid on top of the subregions, according to one or more embodiments.

FIG. 3a illustrates a top-down view of a device having a fourth region as a single entity laid on top of the subregions, according to one or more embodiments. The fourth region 304 shown in FIG. 3 comprises a source region. The fourth region 304 is laid on top of the body region. The body region comprises a first region, a second region, and a third region. In an embodiment, the fourth region 304 is a single entity laid on top of the first region, a second region, and a third region. The fourth region 304 comprises a first conductivity type region. The first conductivity type region may be a n-type region. The fourth region 304 is shown as solid lines in the 2 to 7 o'clock direction. The fourth region 304 does not cover the center portion of the first region.

Figure 3B:
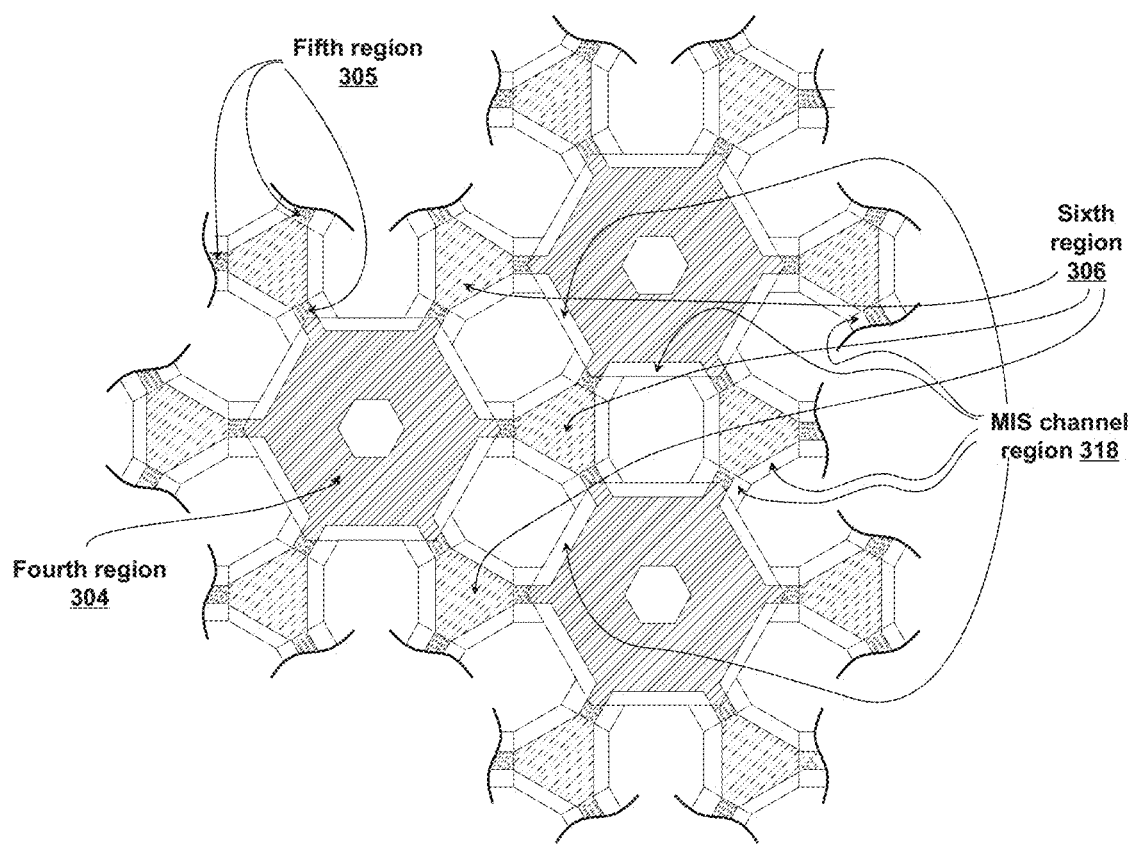
FIG. 3b illustrates a top-down view of a device having multiple regions laid on top of the subregions respectively, according to one or more embodiments.

FIG. 3b illustrates a top-down view of a device having a fourth region as multiple entities laid on top of the subregions respectively, according to one or more embodiments. In an embodiment, the fourth region 304 is divided into multiple entities. In one embodiment, the fourth region 304 comprises a fifth region 305; and a sixth region 306. The fifth region 305 is shown as dashed lines. The sixth region 306 is shown as dot-dot-dashed lines. The fourth region 304, the fifth region 305, and the sixth region 306 are of same conductivity type. In one embodiment, the fourth region 304, the fifth region 305, and the sixth region 306 are of a first conductivity type. The fourth region 304 comprises the source region. The fifth region 305 comprises the source region. The sixth region 306 comprises the source region. In an embodiment, the fourth region 304, the fifth region 305, and the sixth region 306 are formed directly on top of the first region, the second region, and the third region, respectively. In one embodiment, the fourth region 304 is on the first region. The fourth region 304 does not cover the center of the first region. In another embodiment, the fifth region 305 is on the second region. In another embodiment, the sixth region 306 is on the third region.

When merged, the fourth region 304, the fifth region 305 and the sixth region 306 form a single entity of the source region that expands throughout an entirety of the body region (do not cover at the center of the first region), which makes it a spider web shape. The seventh region, in conjunction with the body region, forms a plurality of the MIS channel regions throughout the periphery of the entire body region that are covered by the MIS stack which will be formed later on with the gate insulator and the gate electrode.

In an embodiment, the fourth region 304 does not cover the center of the first region (to form an eighth region (as the p-plus region (not shown)) and form an ohmic contact to both the first region and the fourth region 304 (by means of the silicide formation). The device further comprises the MIS channel region 318 on the first region, the second region, and the third region.

Figure 3C:
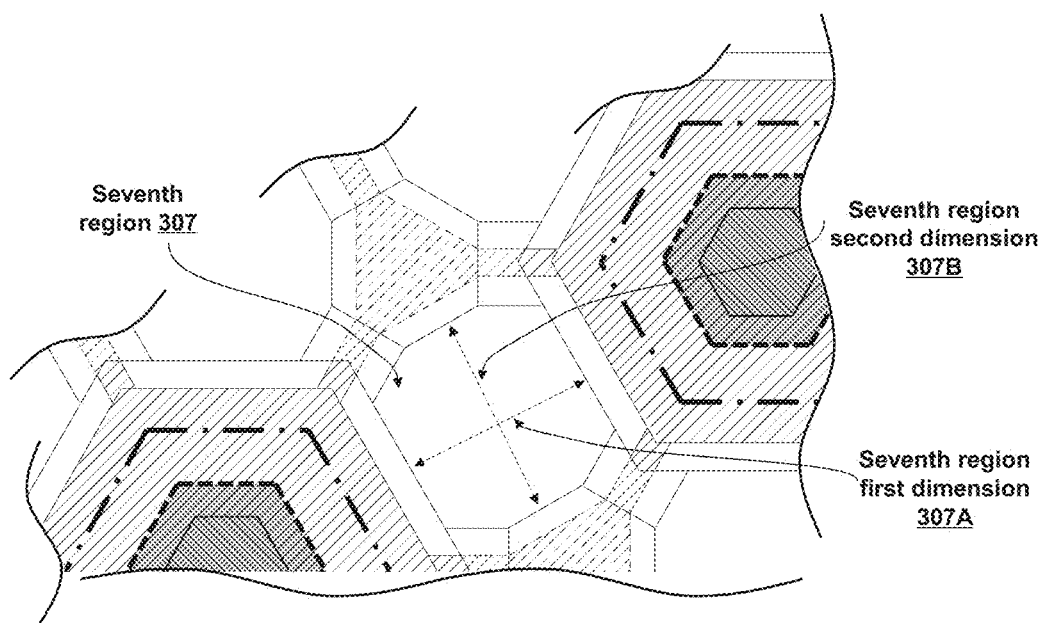
FIG. 3c illustrates dimensions of a seventh region, according to one or more embodiments.

FIG. 3c illustrates a dimensions of a seventh region 307, according to one or more embodiments. The seventh region 307 comprises a seventh region first dimension 307A and a seventh region second dimension 307B. A ratio of the seventh region first dimension 307A to the seventh region second dimension 307B is in a range from 0.3 to 2.0. The dimensions of the seventh region 307 generate MIS channel density (total width of the MIS channel within the unit cell per unit area) that is higher than the conventional device.

Figure 3D:
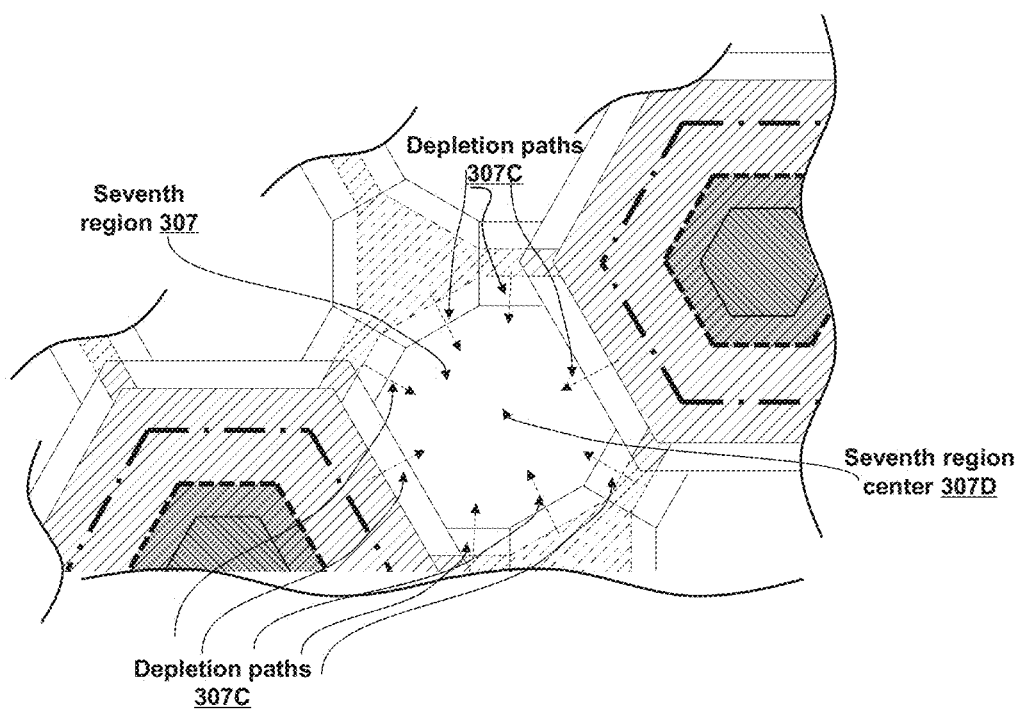
FIG. 3d illustrates a plurality of depletion paths of a seventh region, according to one or more embodiments.

FIG. 3d illustrates a plurality of depletion paths of a seventh region, according to one or more embodiments. The seventh region 307 comprises the plurality of depletion paths 307C extending inwards from all directions (e.g., from the first region, the second region and the third region). In an embodiment, the seventh region 307 comprises a plurality of depletion paths 307C that extends inwards from a plurality of directions from the first region, the second region, and the third region towards a center of the seventh region. The seventh region 307 further comprises a seventh region center 307D which is the most vulnerable region. When the device operates under blocking mode, the most vulnerable region is subjected to the highest electric fields, while the seventh region 307 is subjected to high electric fields.

Typically, the seventh region has only one depletion region in conventional devices since there is only one p-n junction. Whereas the device herein in the present disclosure comprises the first region, the second region and the third region as second conductivity and the seventh region 307 as first conductivity type forming the p-n junction in all sides of the seventh region 307. As the p-n junction in all sides of the seventh region 307, the depletion region can spread from all directions of the seventh region 307 as shown in the FIG. 3d. This results in the device having more robust breakdown performance, blocking performance, or lower electric field. The seventh region center 307D is exposed to the highest electric field. The dimensions of the seventh region 307 enables the seventh region center 307D to have depletion region from all directions enabling it to have lower electric field providing protection to the seventh region center 307D. The depletion by the plurality of depletion paths 307C at the seventh region center 307D is high when compared to depletion at all other points.

Figure 4:
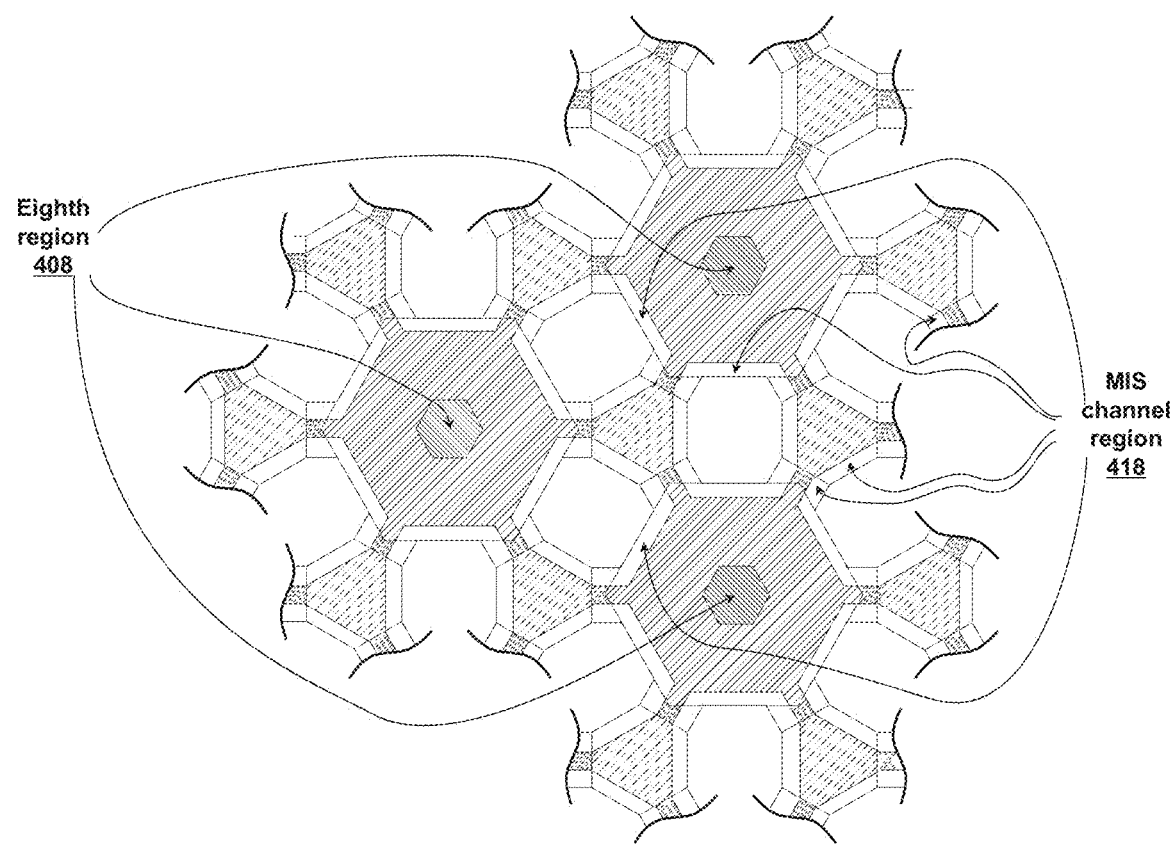
FIG. 4 illustrates a top-down view of a device comprising an eighth region, according to one or more embodiments.

FIG. 4 illustrates a top-down view of a device comprising an eighth region 408, according to one or more embodiments. The eighth region 408 shown in FIG. 4 comprises a p-plus region. The eighth region 408 is shown as a solid line (in 11 to 5 o'clock direction) that completely fills the center of the first region (shown in FIG. 3a). FIG. 4 further shows a Metal-Insulator-Semiconductor (MIS) channel region 418. The MIS channel region 418 may be located on the first region. The MIS channel region 418 may be located on the second region. The MIS channel region 418 may be located on the third region. In an embodiment, the MIS channel region 418 is between the fourth region and a seventh region. In an embodiment, the eighth region 408 is formed by executing the following technical steps. The fourth region is laid onto the first region. The fourth region is laid as the single entity. The fourth region comprises the source region of first conductivity type (e.g., n-type). The etching is then performed to dig a trench through the fourth region and expose the first region. The eighth region 408 is then formed on the first region exposed.

Figure 5:
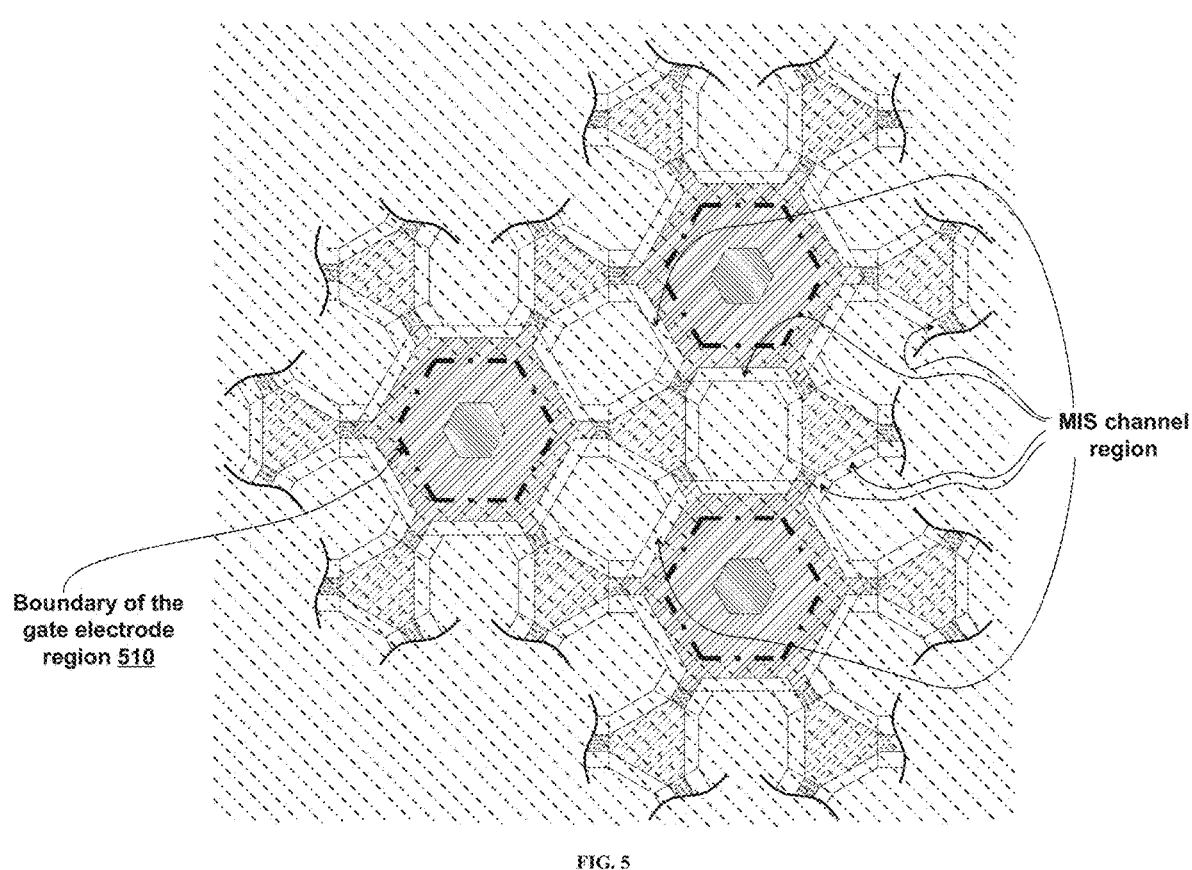
FIG. 5 illustrates a top-down view of a device comprising a gate electrode region, according to one or more embodiments.

FIG. 5 illustrates a top-down view of a device comprising a gate electrode region, according to one or more embodiments. The gate electrode region is patterned directly on top of the gate insulator region (not shown). The gate electrode region is shown by dash-dot lines in FIG. 5. With the gate electrode region patterned directly on top of the gate insulator region, the MIS structure is formed directly on top of the plurality of the MIS channel region defined previously. Immediately forming the gate electrode region patterned, an interlayer dielectric (ILD) region (not shown) blanket is formed directly on top of the SiC surface of the device. FIG. 5 further shows a boundary of the gate electrode region 510 patterned on top of the gate insulator region. FIG. 5 depicts that the gate electrode region does not reside fully on top of the first region, and the eighth region.

Figure 6:
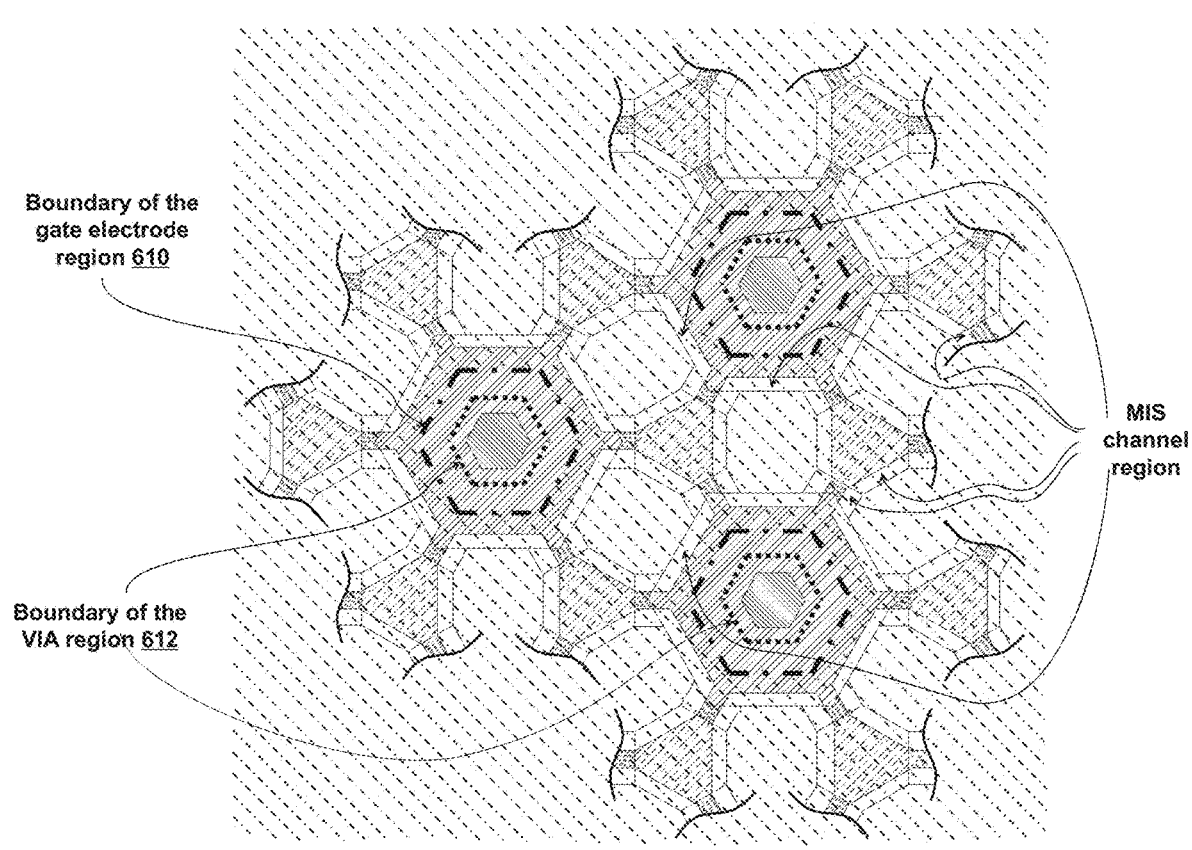
FIG. 6 illustrates a top-down view of a device comprising a VIA region, according to one or more embodiments.

FIG. 6 illustrates a top-down view of a device comprising a VIA region, according to one or more embodiments. Once the ILD region is deposited, the VIA region is formed by etching the ILD region. The boundary of the VIA region 612 is shown in the FIG. 6. The VIA region is shown as a thick dotted line. After the ILD etching step to form the VIA region, the VIA region reveals the entireness of the eighth region and a portion of the fourth region, which is silicide at the next step. FIG. 6 depicts the boundary of the VIA region 612 within the boundary of the gate electrode region 610.

Figure 7:
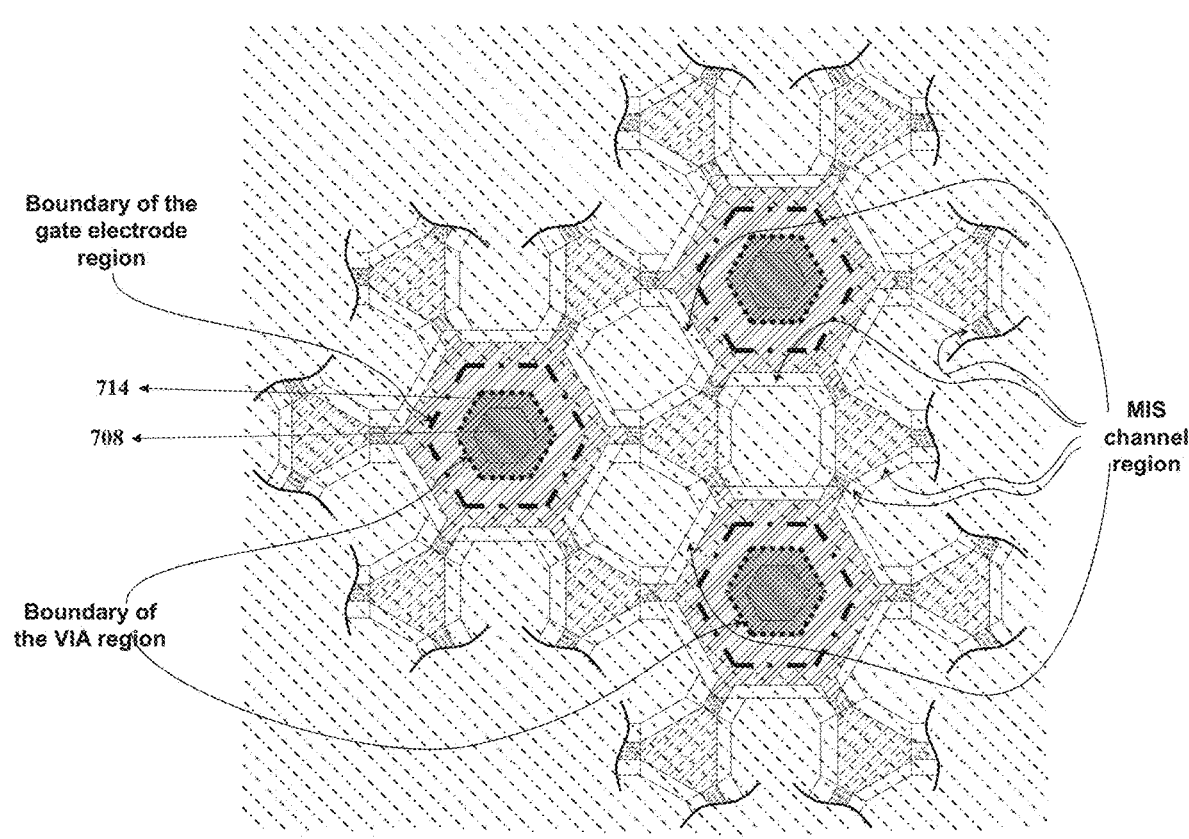
FIG. 7 illustrates a top-down view of a device comprising a silicide contact region, according to one or more embodiments.

FIG. 7 illustrates a top-down view of a device comprising a silicide contact region 714, according to one or more embodiments. The silicide contact region 714 forms an ohmic contact to both the eighth region 708 and the fourth region. FIG. 7 depicts that the silicide contact region 714 is fully surrounded by the VIA region. Followed by the silicide formation, a source metal region covers the top of the SiC surface.

Figure 8:
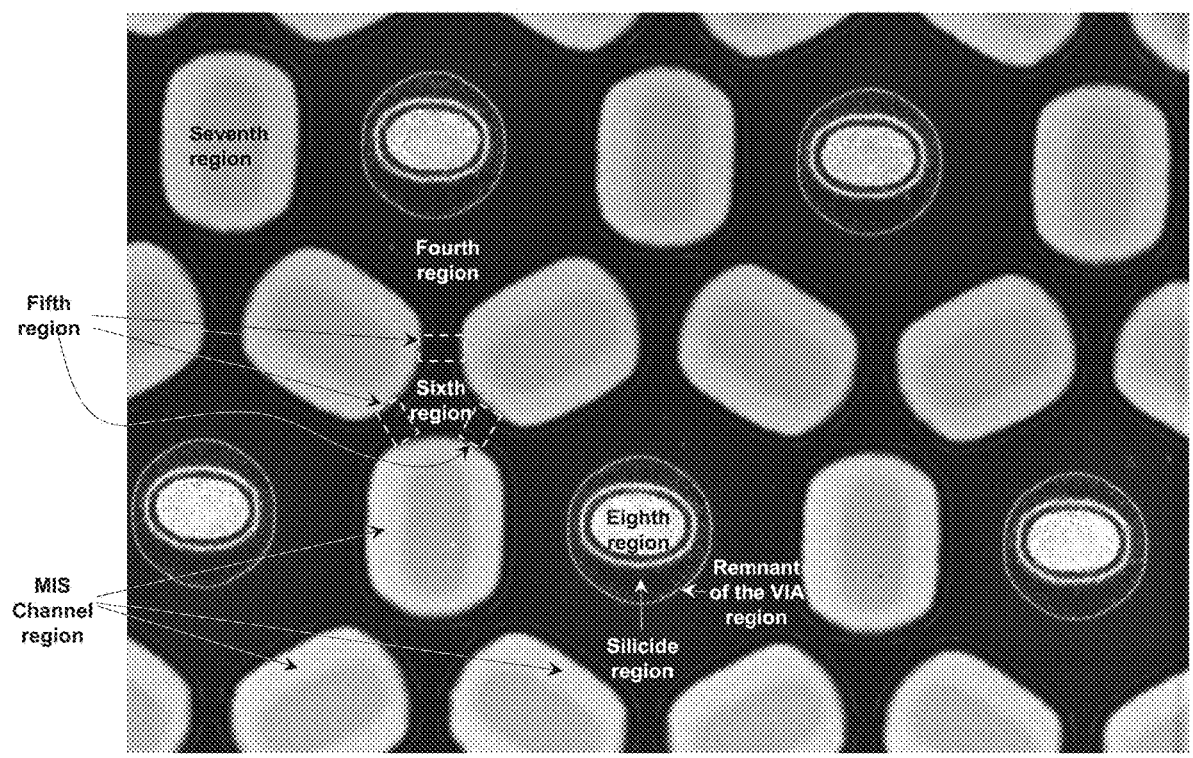
FIG. 8 illustrates an actual Scanning Electron Microscope (SEM) image of a fabricated device, according to one or more embodiments.

FIG. 8 illustrates an actual Scanning Electron Microscope (SEM) image of a fabricated device, according to one or more embodiments. The Scanning Electron Microscope (SEM) image of the fabricated device shows various elements of the device illustrated in FIG. 2 such as the fourth region, fifth region, sixth region, seventh region, eighth region, MIS channel region, VIA region, silicide region, etc. However, the SEM image does not depict the gate insulator region, the gate electrode region, the ILD region, and the source metal region.

Figure 9:
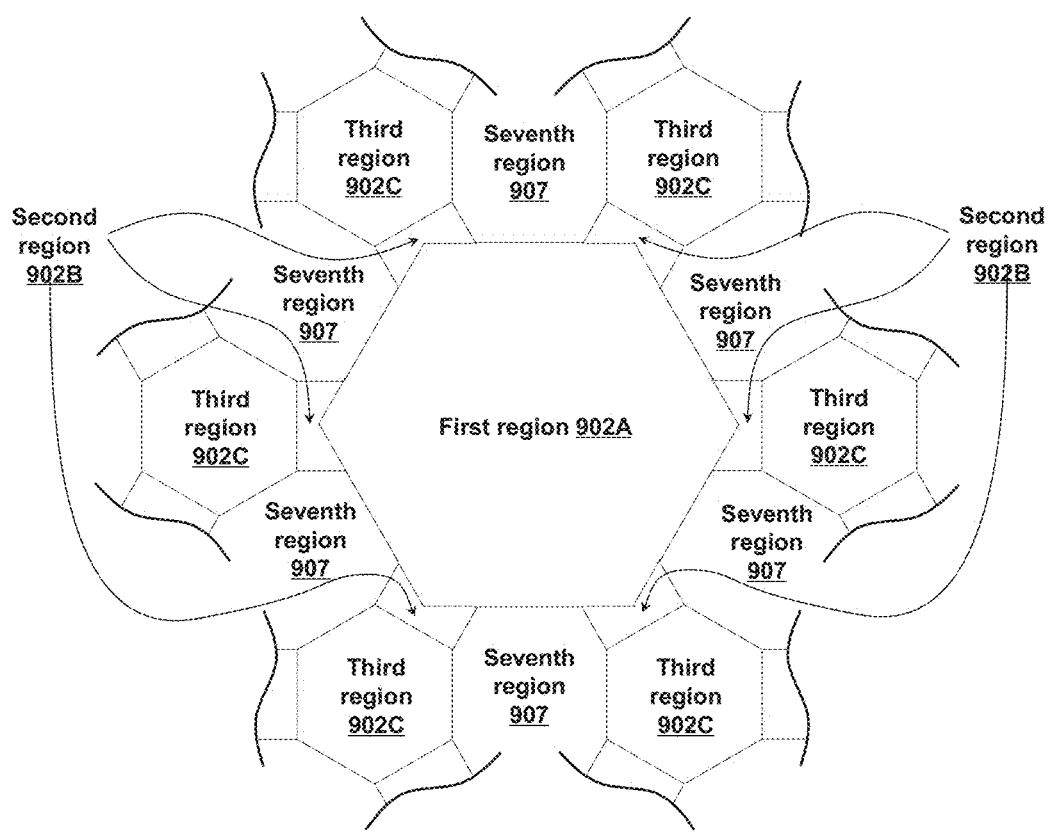
FIG. 9 illustrates a zoomed in image of a device of FIG. 2, according to one or more embodiments.

FIG. 9 illustrates a zoomed in image of a device of FIG. 2, according to one or more embodiments. FIG. 9 depicts the layout of the connection of the subregions of the body region. The body region comprises the first region 902A, the second region 902B, and the third region 902C. The second region 902B connects the first region 902A, and the third region 902C with a periodicity. The body region comprises the first region 902A, the second region 902B, and the third region 902C that repeats with periodicity of any number of times. The periodicity may be a fixed interval space. In an embodiment, the periodicity may be an irregular interval space. The second region 902B connects the first region 902A and the third region 902C at all corners of the unit cell. The seventh region 907 may be surrounded by the first region 902A, the second region 902B, and the third region 902C. In an embodiment, the seventh region 907 may be a region between the successive body regions of the unit cell. The seventh region 907 may be a first conductivity type. The first conductivity type may be n-type.

Figure 10:
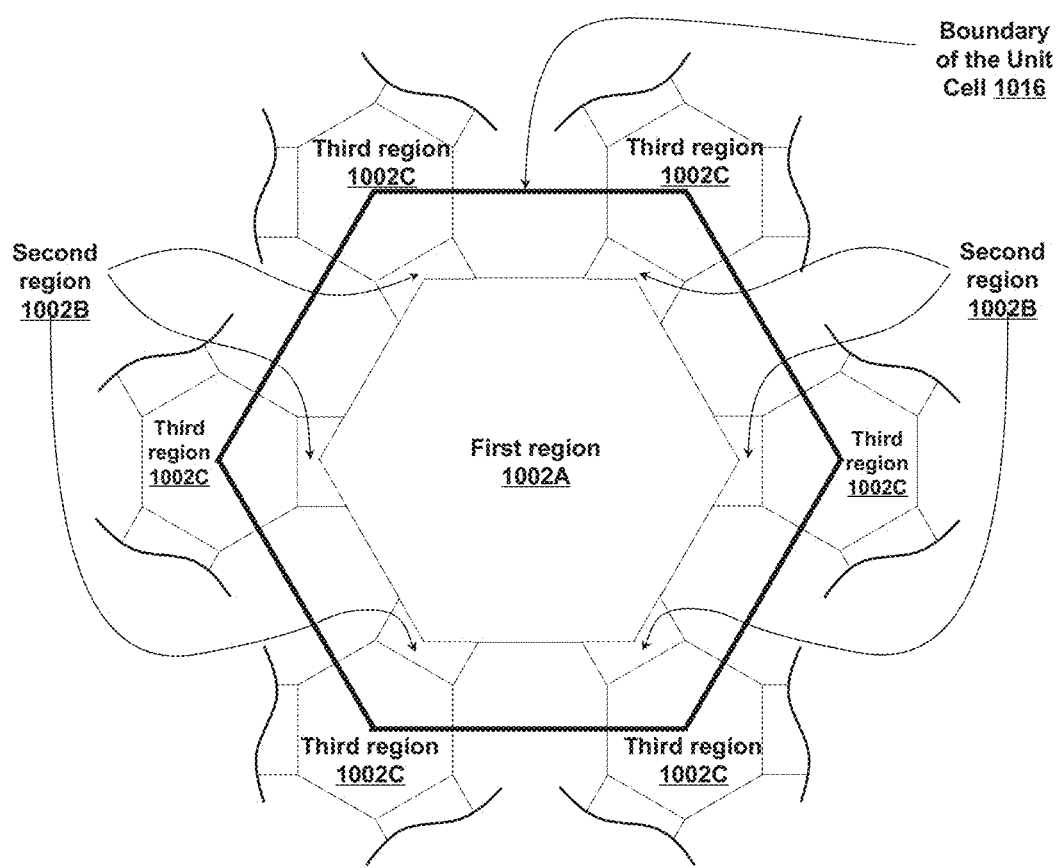
FIG. 10 illustrates a boundary of a unit cell, according to one or more embodiments.

FIG. 10 illustrates a boundary of a unit cell 1016, according to one or more embodiments. The body region comprises the first region 1002A, the second region 1002B, and the third region 1002C. FIG. 10 depicts the boundary of a unit cell 1016 that overlays the segmented body region. The boundary of the unit cell 1016 is shown by a thick solid line. The boundary of the unit cell 1016 may be hexagonal shaped. In an embodiment, the boundary of the unit cell 1016 may be polygon shaped. In another embodiment, the boundary of the unit cell 1016 may be circle shaped or oval shaped.

Figure 11:
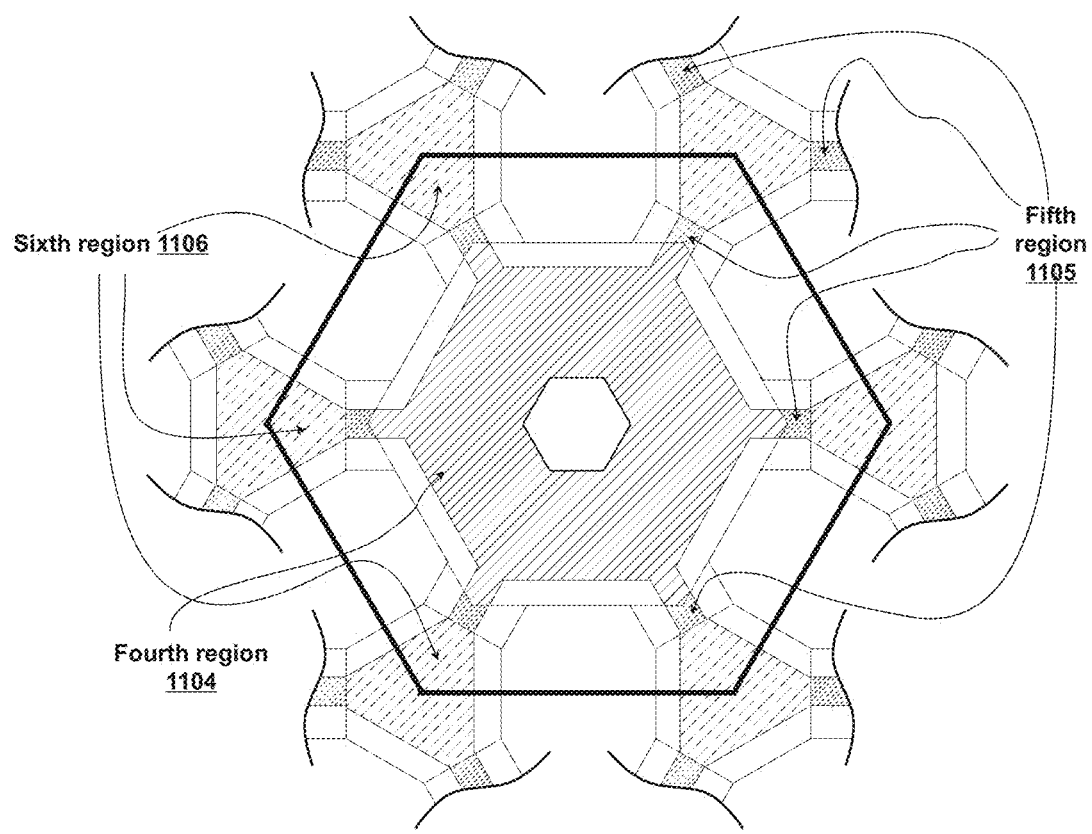
FIG. 11 illustrates a unit cell of a device having a fourth region, divided into subregions, laid on top of the body region, according to one or more embodiments.

FIG. 11 illustrates a unit cell of a device having a fourth region, divided into subregions, laid on top of the body region, according to one or more embodiments. The fourth region 1104 shown in FIG. 11 comprises a source region. The fourth region 1104 is laid on top of the body region. The body region comprises a first region, a second region, and a third region. The fourth region 1104 comprises a first conductivity type region. The first conductivity type region may be a n-type region. The fourth region 1104 is shown as solid lines in the 2 to 7 o'clock direction.

In an embodiment, the fourth region 1104 is divided into multiple entities. In one embodiment, the fourth region 1104 comprises a fifth region 1105; and a sixth region 1106. The fifth region 1105 is shown as dashed lines. The sixth region 1106 is shown as dot-dot-dashed lines. The fourth region 1104, the fifth region 1105, and the sixth region 1106 are of same conductivity type. In one embodiment, the fourth region 1104, the fifth region 1105, and the sixth region 1106 are of a first conductivity type. In an embodiment, the fourth region 1104, the fifth region 1105, and the sixth region 1106 are formed directly on top of the first region, the second region, and the third region, respectively. In an embodiment, when merged, the fourth region 1104, the fifth region 1105 and the sixth region 1106 form a single entity of the source region that expands throughout an entirety of the body region, which makes it a spider web shape.

In an embodiment, the fourth region 1104 is do not cover the center of the first region (to form an eighth region (as the p-plus region (not shown)) and form an ohmic contact to both the first region and the fourth region 1104 (by means of the silicide formation).

Figure 12:
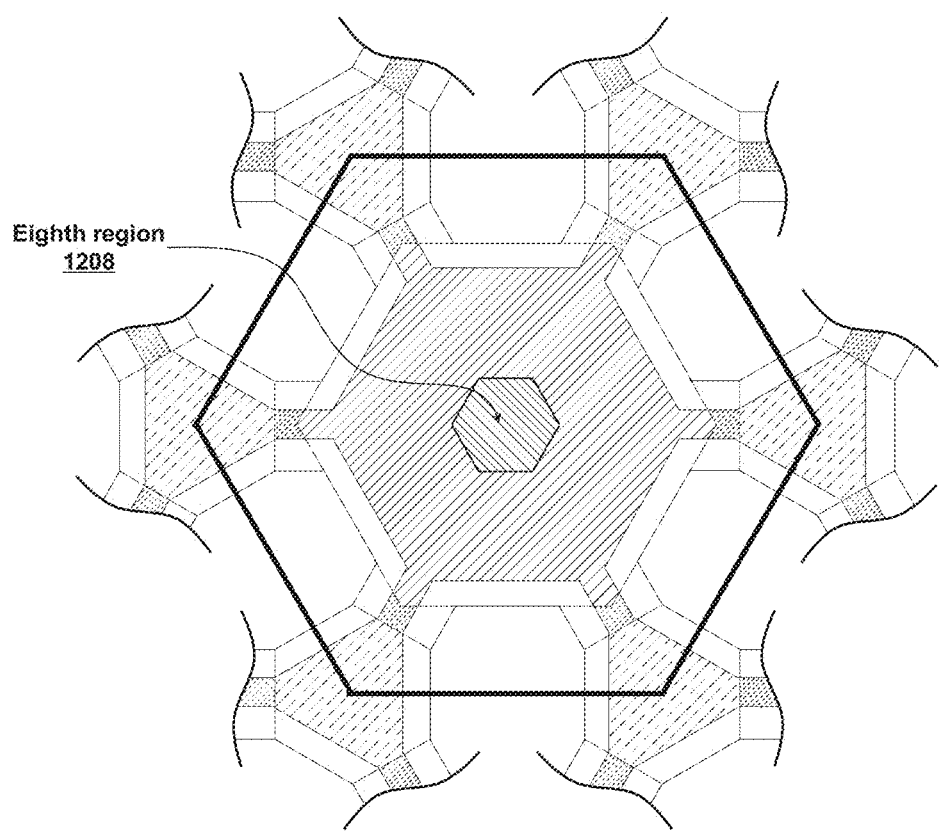
FIG. 12 illustrates a unit cell of a device showing an eighth region, according to one or more embodiments.

FIG. 12 illustrates a unit cell of a device showing an eighth region 1208, according to one or more embodiments. The eighth region 1208 comprises plus region (e.g., plus region). The eighth region 1208, the first region, the second region and the third region may be of second conductivity type. The second conductivity type may be p-type. The eighth region is formed on the center of the first body region. The eighth region is shown by solid lines in the 11 to 5 o'clock direction.

Figure 13:
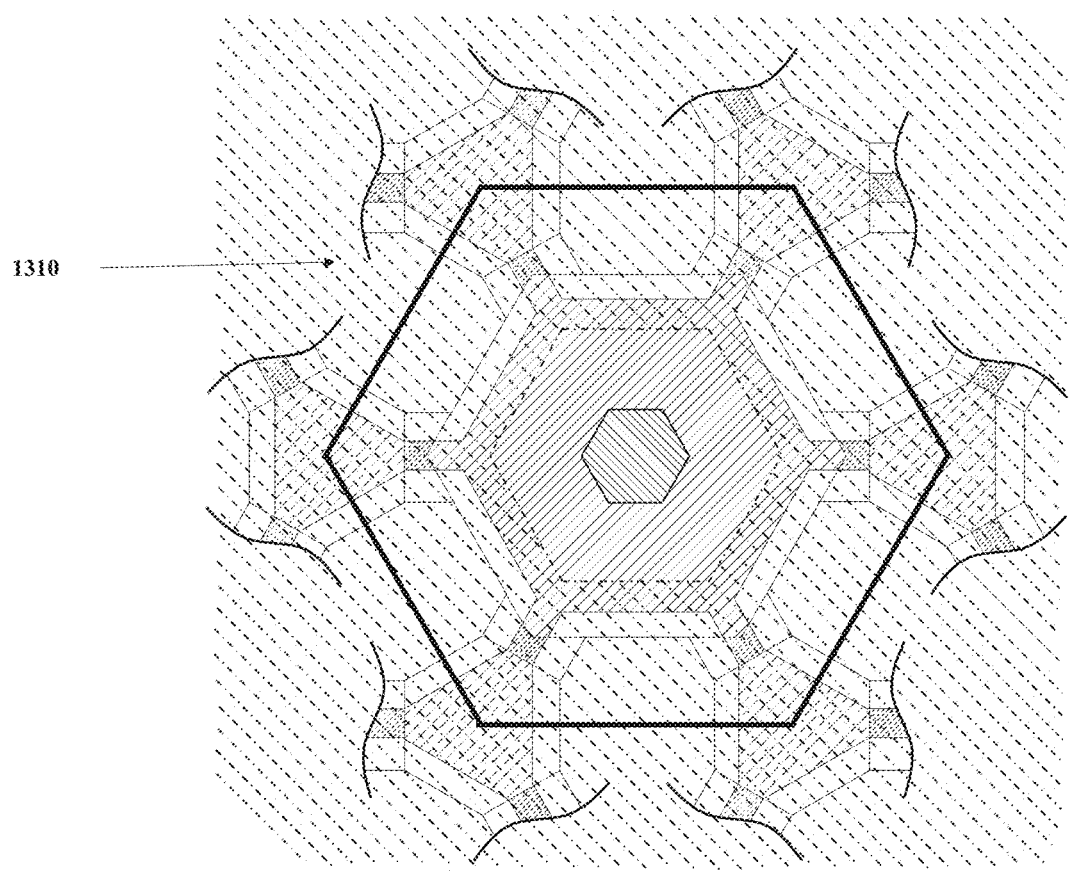
FIG. 13 illustrates a unit cell of a device showing a gate electrode region, according to one or more embodiments.

FIG. 13 illustrates a unit cell of a device showing a gate electrode region 1310, according to one or more embodiments. The gate electrode region 1310 is patterned directly on top of the gate insulator region (not shown). The gate electrode region 1310 is shown by dash-dot lines in FIG. 13. With the gate electrode region 1310 patterned directly on top of the gate insulator region, the MIS structure is formed directly on top of the plurality of the MIS channel region defined previously. Immediately forming the gate electrode region 1310 patterned, an interlayer dielectric (ILD) region (not shown) blanket is formed directly on top of the SiC surface of the device. FIG. 13 further shows a boundary of the gate electrode region patterned on top of the gate insulator region. FIG. 13 depicts that the gate electrode region 1310 does not reside fully on top of the first region, and the eighth region.

Figure 14:
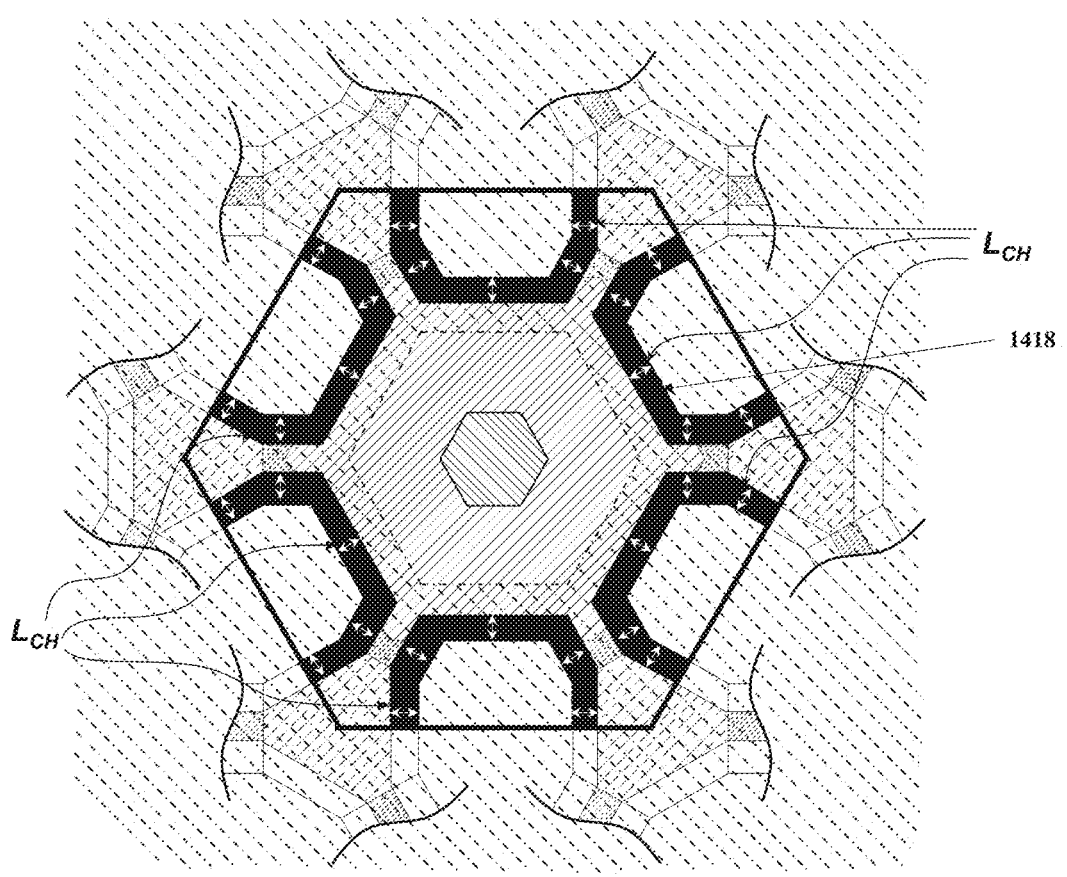
FIG. 14 illustrates a unit cell of a device showing a MIS channel region, according to one or more embodiments.

FIG. 14 illustrates a unit cell of a device showing a MIS channel region 1418, according to one or more embodiments. The MIS channel region 1418 is located on the first region. The MIS channel region 1418 is located on the second region. In an embodiment, the MIS channel region 1418 is located on the third region. In an embodiment, the MIS channel region 1418 is between the fourth region and a seventh region. The MIS channel region 1418 residing on the first region extends onto the second region and the third region. The length of the MIS channel region 1418 is referred to as $L_{CH}$. The MIS channel region 1418 is highlighted with inverted tone—black in FIG. 14. The density of the MIS channel region is increased by extending the MIS channel region 1418 onto the second region and the third region. The increase of the density of the MIS channel region decreases the conduction loss during the on-state mode of operation. The first region provides the area for the source contact to keep all three sub regions of the body region at the ground potential, while providing a MOS channel region. The second region connects the first region and the third region to keep the third region at the ground potential.

The third region, being grounded from the electric potential perspective, prevents the electric field intensification in vicinities of all six corners of the polygon (e.g., hexagon, etc.) of the first region. The second region and the third regions present are not just to provide the required blocking performance, but also to contribute to the carrier conduction path and lower the on-state conduction. The layout shows both the body region and the source regions—both presented in a single entity throughout the active region, which means that the third and second region of the body regions are equipped with the MIS channel within. The physical increase of the MIS channel region happens throughout the active region of the device, and therefore, maximizes the benefit of the periodicity that hexagon provides.

Figure 15:
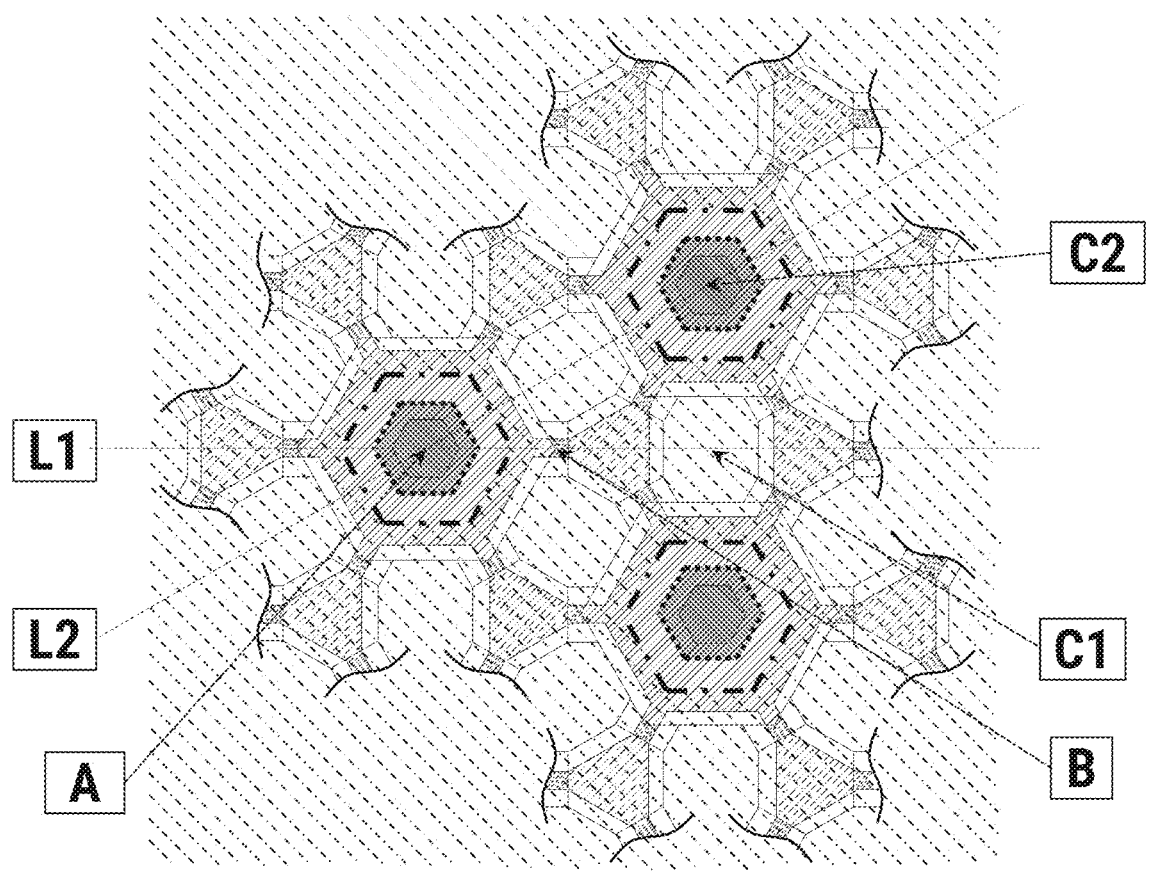
FIG. 15 illustrates reference lines and points to be used for cross sections of the device, according to one or more embodiments.

FIG. 15 illustrates reference lines and points to be used for cross sections of the device, according to one or more embodiments. FIG. 15 depicts cross sections C1 and C2 of the device. The figure further shows the reference lines L1 and L2 for the cross sections. The figure further shows the reference points A and B to be used for the cross sections.

Figure 16:
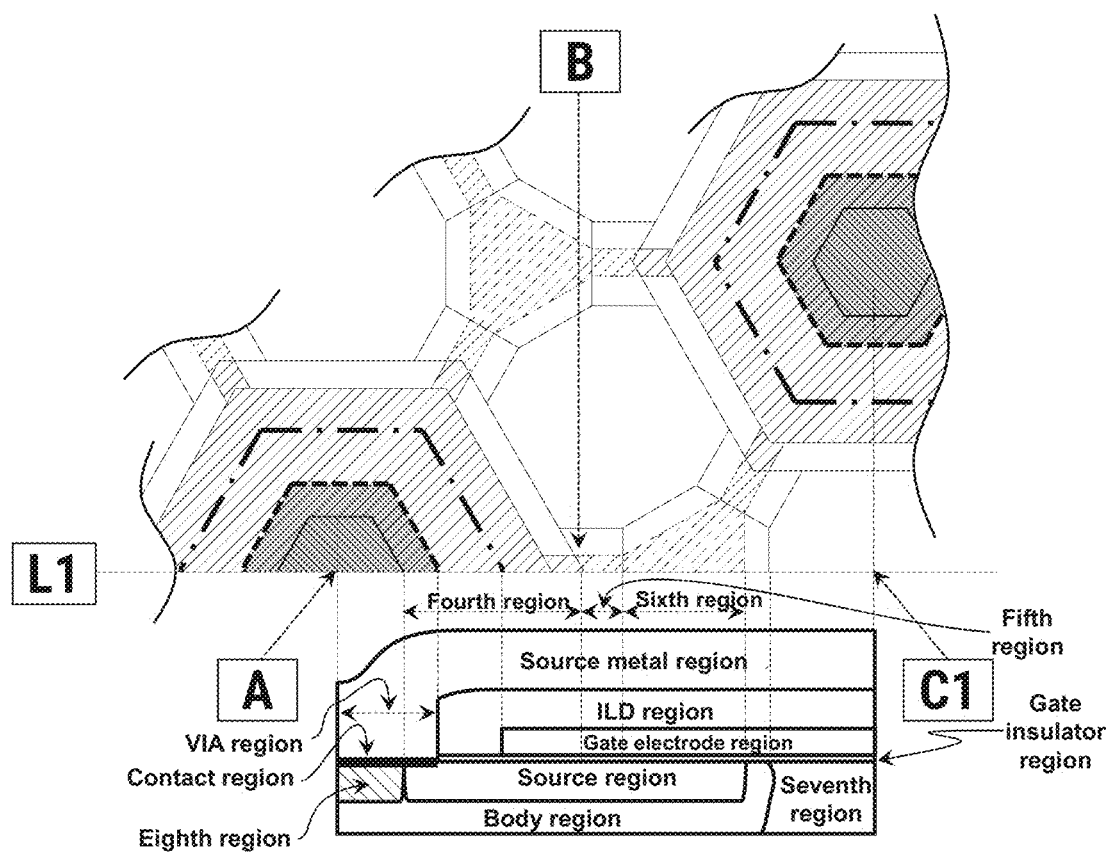
FIG. 16 illustrates a unit cell of the device structures in vicinity of the SiC surface, according to one or more embodiments.

FIG. 16 illustrates a unit cell of the device structures in vicinity of the SiC surface, according to one or more embodiments. FIG. 16 depicts the schematic view of the device in connection with the cross sections to intelligibly illustrate the arrangements of the components within the device. The device shown in FIG. 16 comprises the body region. The body region comprises subregions such as the first region, the second region, and the third region. The first region comprises the first body region. The second region comprises the second body region. The third region comprises the third body region. The source region (i.e., the fourth region) is onto top of the subregions of the body region. The fourth region comprises the fifth region, and the sixth region. The fourth region is on the first region. The fifth region is on the second region. The sixth region is on the third region.

The device further comprises an eighth region on the surface of SiC surface. The source region is adjacent to the eighth region. In an embodiment, the eighth region is of a second conductivity type. The eighth region comprises the plus region (e.g., p-plus region). The eighth region, and the body region are of the same conductivity type (i.e., second conductivity type). The device also comprises the seventh region. The seventh region comprises the JFET region. The seventh region is surrounded by the first region, the second region and the third region. The unit cell further comprises: a drift region (not shown); a substrate region (not shown); a gate insulator region; a gate electrode region; an interlayer dielectric region; a source metal region; and a drain metal region (not shown). In an embodiment, the first region comprises a contact region. The device further comprises a VIA region. The contact region (i.e., silicide contact) is on the eighth region and the fourth region.

Figure 17:
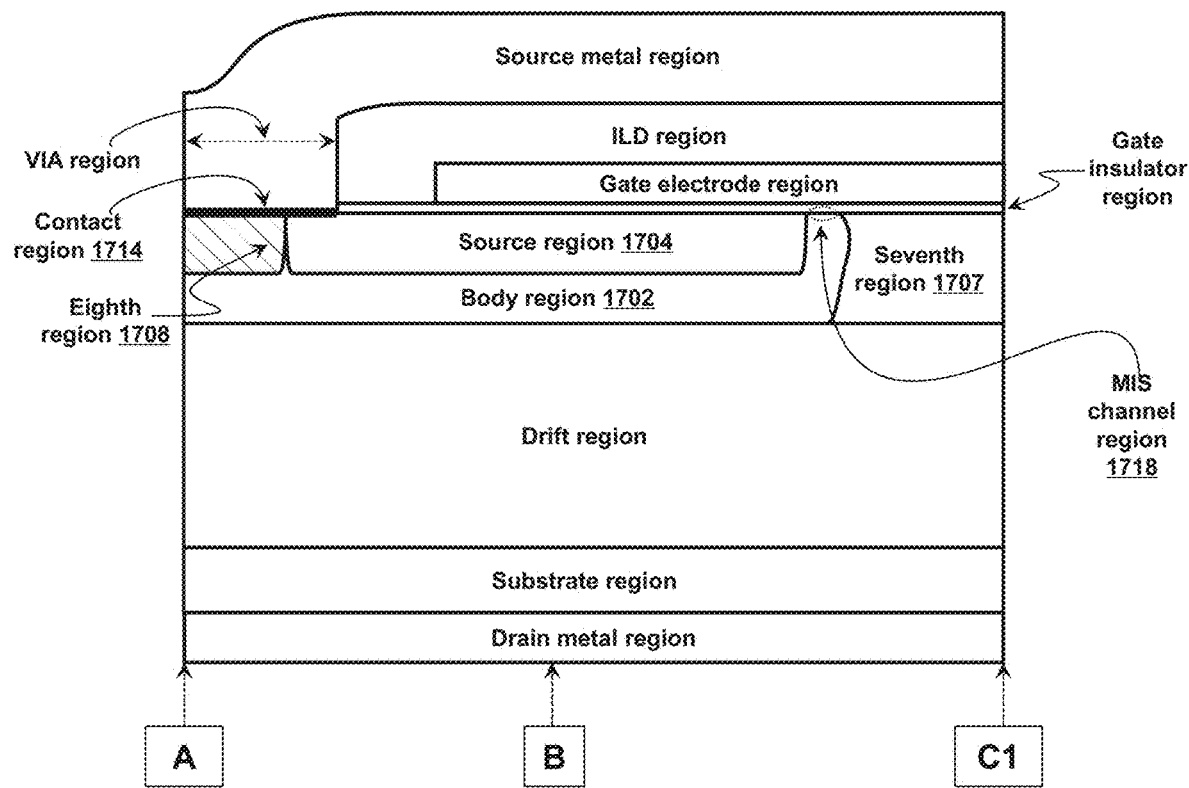
FIG. 17 shows an embodiment of a device, according to one or more embodiments.

FIG. 17 shows an embodiment of a device, according to one or more embodiments. The device shown in FIG. 17 is a metal oxide semiconductor field-effect transistor (MOSFET). The device comprises a body region 1702, a source region 1704 (i.e., a fourth region). The body region 1702 comprises a first region, a second region and a third region. The source region 1704 may comprise a fifth region and a sixth region (not shown). The source region 1704 is located on the body region 1702. The device comprises a MIS Channel region 1718 located between the fourth region and a seventh region. The MIS Channel region 1718 is located in the first region, the second region and the third region.

The seventh region 1707 is surrounded by the first region, the second region and the third region. The seventh region 1707 is between the successive body regions of the unit cell. The seventh region 1707 and the fourth region are of first conductivity type. The first conductivity type may be n-type. The device also comprises an eighth region 1708, a VIA region, and a contact region 1714. The contact region 1714 may be a silicide contact region. The contact region 1714 forms an ohmic contact to both the eighth region 1708 and the fourth region. The contact region 1714 is surrounded by the VIA region.

The device further comprises a drift region, a substrate region, a gate insulator region, a gate electrode region, an (ILD) interlayer dielectric region, a source metal region, and a drain metal region. The drift region may be of first conductivity type (e.g., n-type). The drift region may be n-drift region. The substrate region may be n+ substrate region. The gate insulator region may be a gate oxide layer. The gate electrode region may be a poly gate layer.

Figure 18:
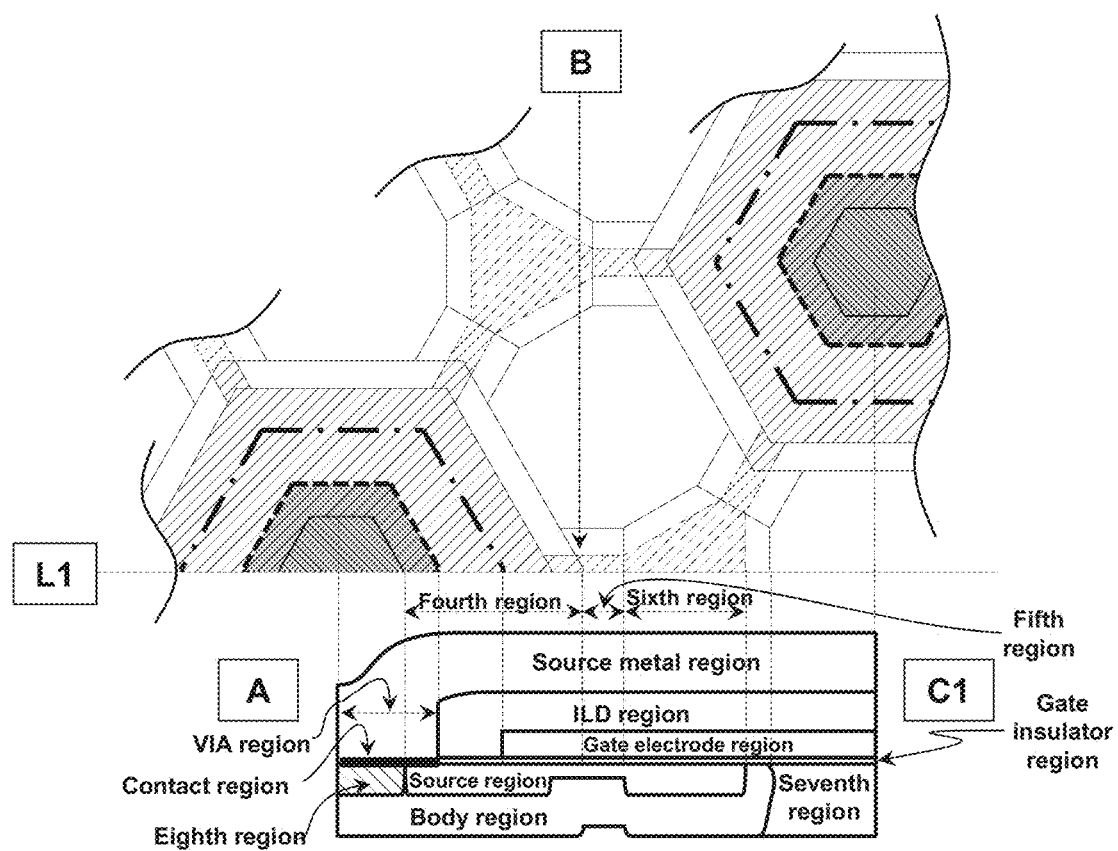
FIG. 18 and FIG. 19 illustrate a variation for the cross sections [A]-[C1] where the depths of the portions of the fifth region and the body region located in the vicinity of the second region is shallow, according to one or more embodiments.
Figure 19:
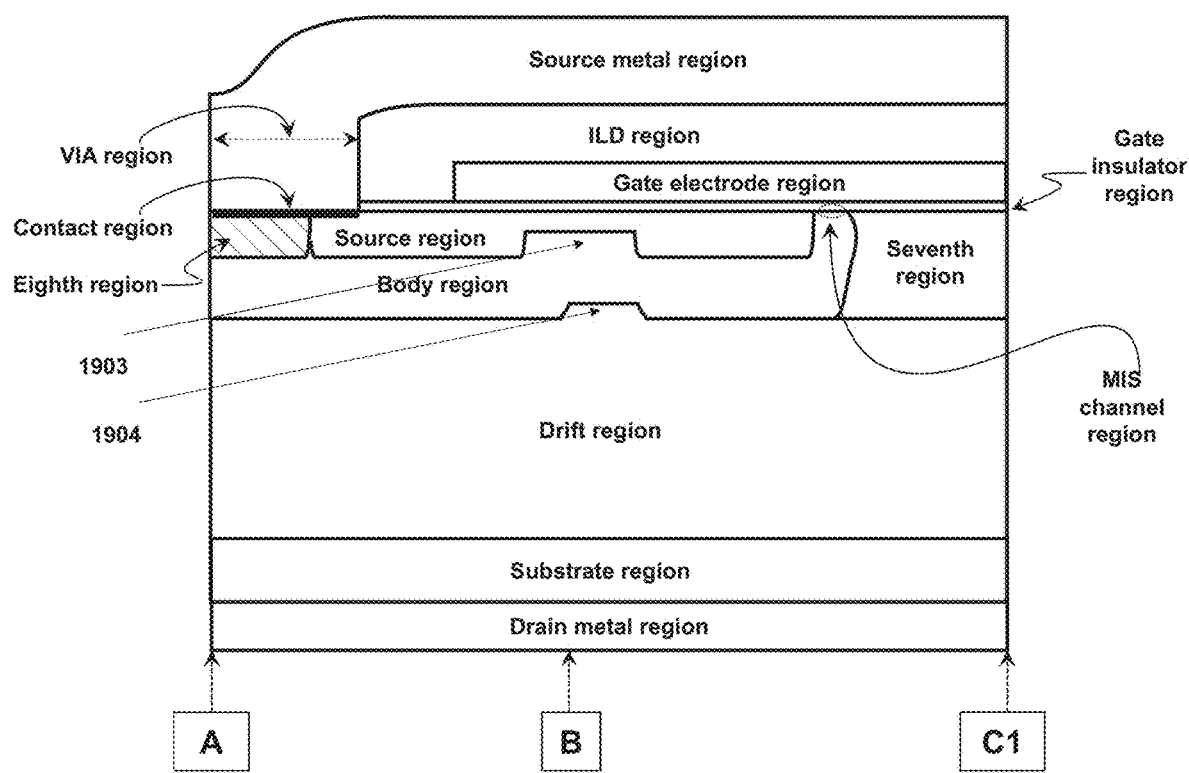

FIG. 18 and FIG. 19 illustrate a variation for the cross sections [A]-[C1] where the depths of the portions of the fifth region and the body region located in the vicinity of the second region is shallow, according to one or more embodiments. FIG. 18 depicts the schematic view of the device in connection with the cross sections to intelligibly illustrate the arrangements of the components within the device, according to one or more embodiments. FIG. 19 shows an embodiment of the device where the depths of the portions of the fifth region and the body region located in the vicinity of the second region is shallow. The depth of the fourth region is shallow in vicinity of the second region as shown in 1903. The depth of the body region is also shallow in the vicinity of the second region as shown in 1904. In an embodiment, a depth of the fourth region is shallow in vicinity of the third region. In an embodiment, a depth of the body region is also shallow in the vicinity of the third region. The device further comprises other regions as illustrated in FIG. 17.

Figure 20:
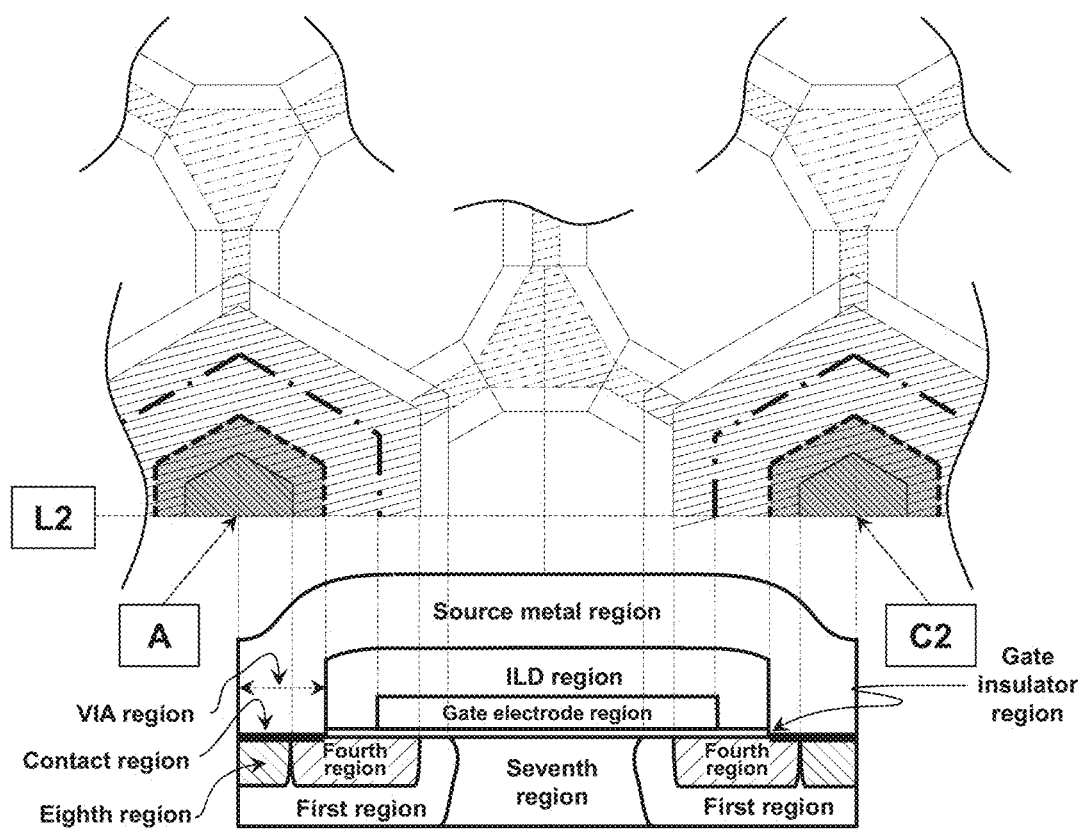
FIG. 20 and FIG. 21 illustrate a variation for the cross sections [A]-[C2], according to one or more embodiments.
Figure 21:
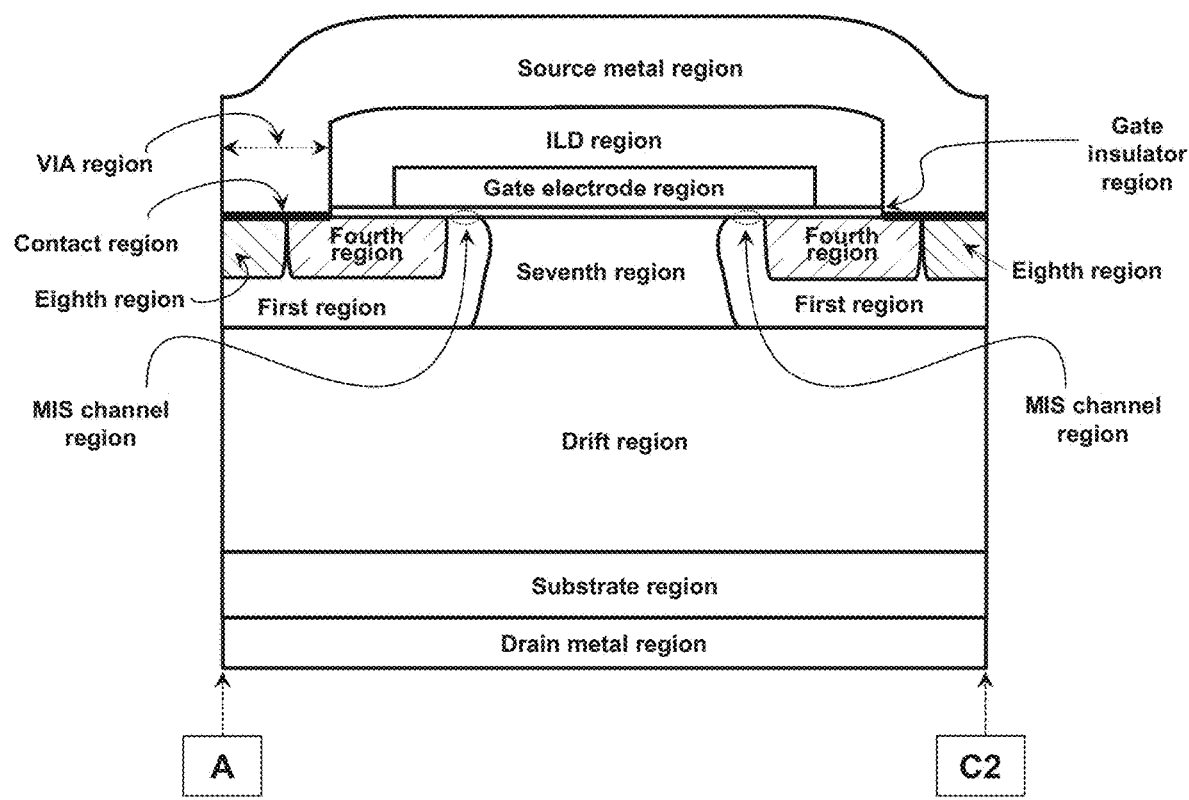

FIG. 20 and FIG. 21 illustrate a variation for the cross sections [A]-[C2], according to one or more embodiments. FIG. 20 depicts the schematic view of the device in connection with the cross sections to intelligibly illustrate the arrangements of the components within the device, according to one or more embodiments. FIG. 20 shows the device structure in vicinity of the SiC surface. FIG. 21 shows a schematic view according to a variation for the cross sections [A]-[C2]. The device comprises a seventh region between successive body regions. The device further comprises an eight region adjacent to the fourth region.

The device comprises a MIS Channel region between the fourth region and the seventh region. The device comprises a contact region and a VIA region. The contact region may be a silicide contact region. The contact region forms an ohmic contact to both the eighth region and the fourth region. The contact region is surrounded by the VIA region.

The device further comprises a drift region, a substrate region, a gate insulator region, a gate electrode region, an (ILD) interlayer dielectric region, a source metal region, and a drain metal region. The drift region may be of first conductivity type (e.g., n-type). The drift region may be n-drift region. The substrate region may be n+ substrate region. The gate insulator region may be a gate oxide layer. The gate electrode region may be a poly gate layer.

Figure 22:
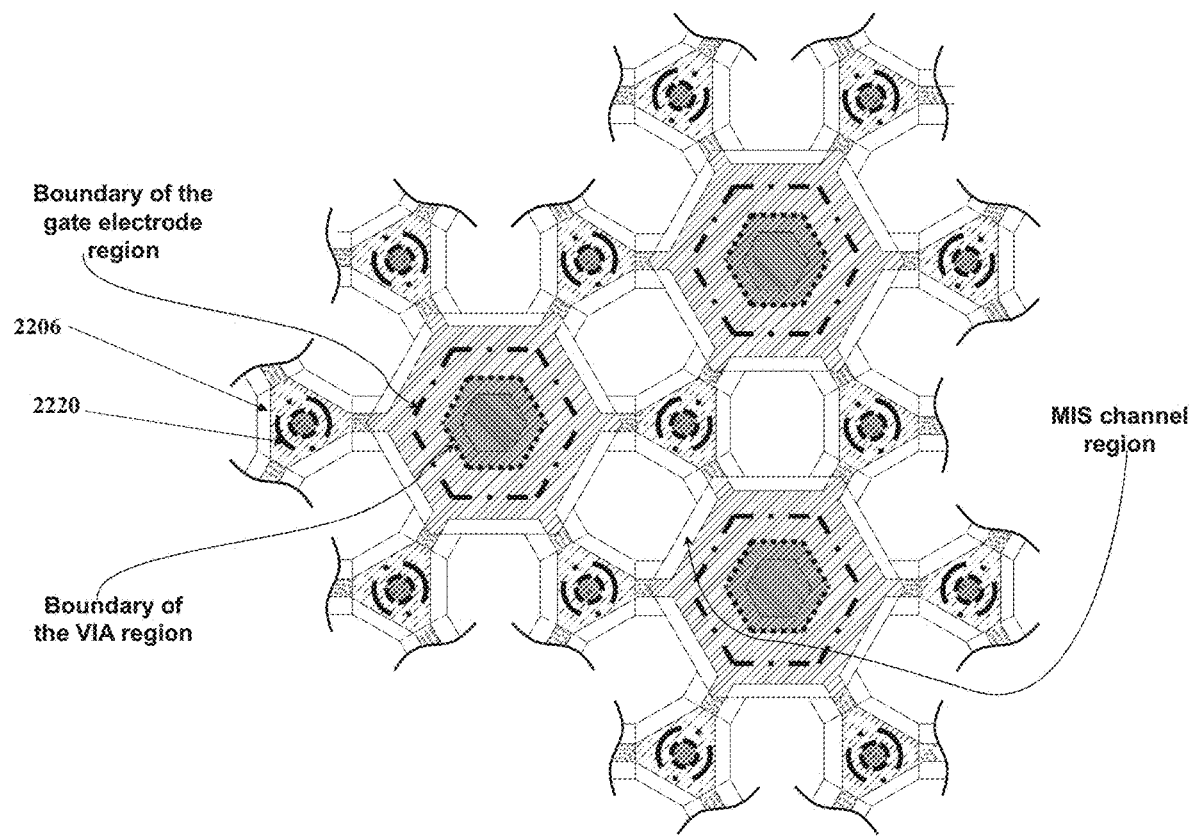
FIG. 22 illustrates a layout of a device having a second contact region on the sixth region, according to one or more embodiments.

FIG. 22 illustrates a layout of a device having a second contact region 2220 on the sixth region, according to one or more embodiments. The second contact region 2220 is located on the sixth region 2206. The second contact region 2220 comprises a plus region. The second contact region 2220 comprises a second conductivity type region (e.g., p-type). The second contact region 2220 and the body regions are of the same conductivity type (e.g., p-type). FIG. 22 further depicts the boundary of the gate electrode region and the boundary of the VIA region.

Figure 23:
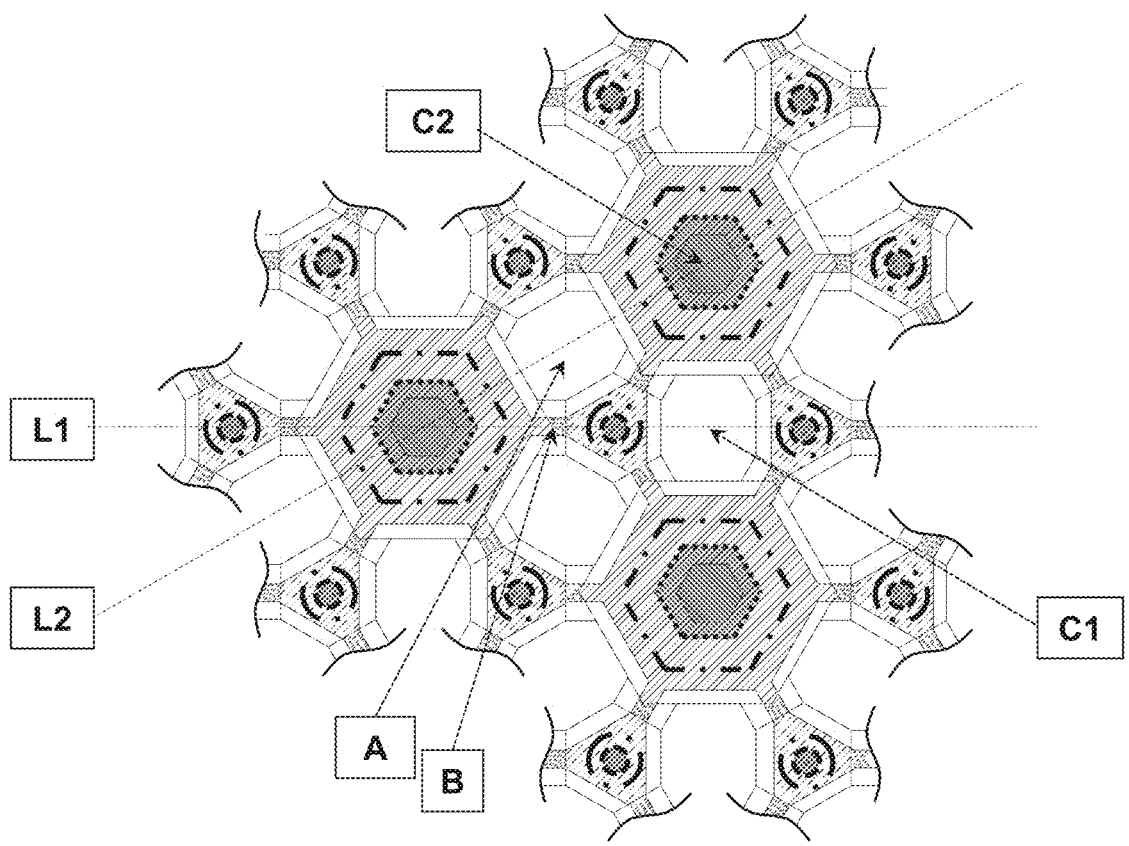
FIG. 23 illustrates reference lines and points to be used for cross sections of the device having the second contact region on the sixth region, according to one or more embodiments.

FIG. 23 illustrates reference lines and points to be used for cross sections of the device having the second contact region on the sixth region, according to one or more embodiments. FIG. 23 depicts cross sections C1 and C2 of the device. The figure further shows the reference lines L1 and L2 for the cross sections. The figure further shows the reference points A and B to be used for the cross sections.

Figure 24:
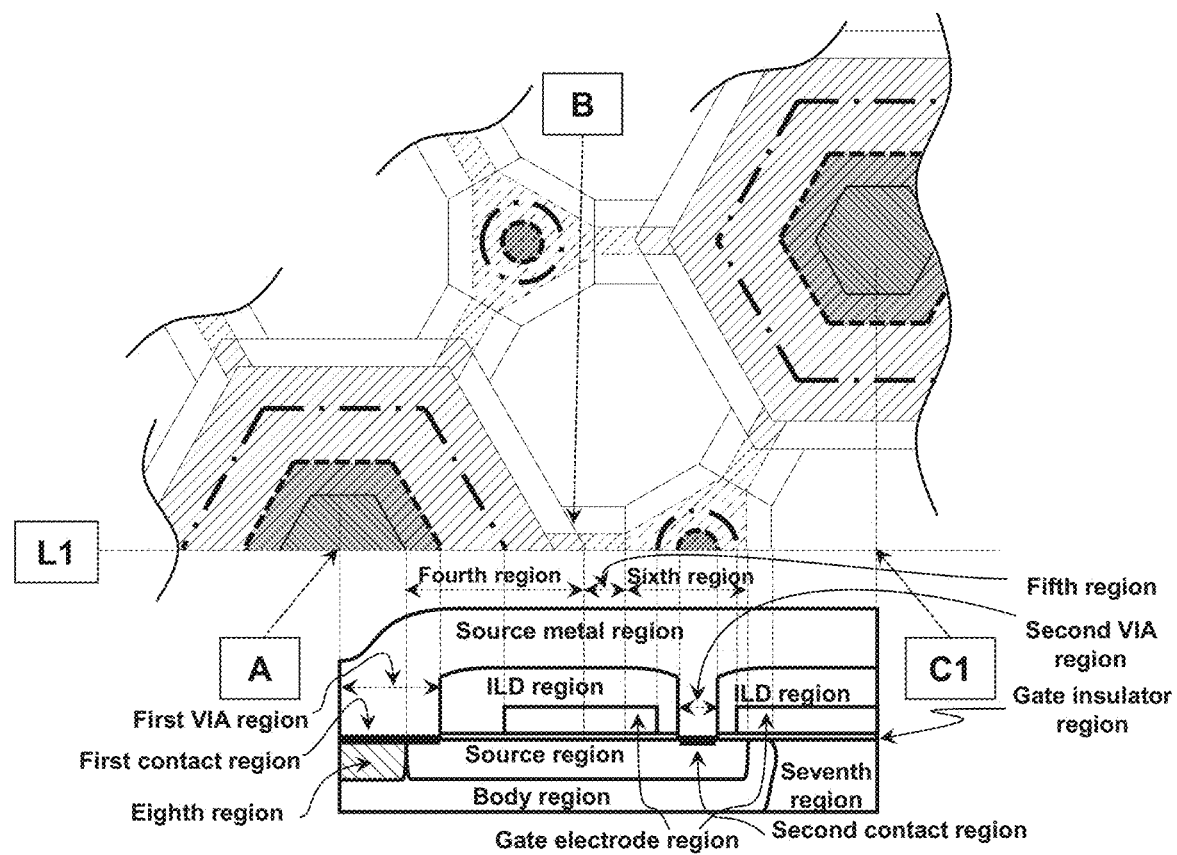
FIG. 24 illustrates a unit cell of the device structures in vicinity of the SiC surface, according to one or more embodiments.

FIG. 24 illustrates a unit cell of the device structures in vicinity of the SiC surface, according to one or more embodiments. FIG. 24 depicts the schematic view of the device in connection with the cross sections to intelligibly illustrate the arrangements of the components within the device. The device shown in FIG. 24 comprises the body region. The body region comprises subregions such as the first region, the second region, and the third region. The first region comprises the first body region. The second region comprises the second body region. The third region comprises the third body region. The source region (i.e., the fourth region) is on top of the subregions of the body region. The fourth region may comprise the fifth region, and the sixth region. The fourth region is on the first region. The fifth region is on the second region. The sixth region is on the third region.

The device further comprises an eighth region on the surface of SiC surface. The source region is adjacent to the eighth region. In an embodiment, the eighth region is of a second conductivity type. The eighth region comprises the plus region (e.g., p-plus region). The eighth region, and the body region are of the same conductivity type (i.e., second conductivity type). The device also comprises the seventh region. The seventh region comprises the JFET region. The seventh region is surrounded by the first region, the second region and the third region. The unit cell further comprises: a drift region (not shown); a substrate region (not shown); a gate insulator region; a gate electrode region; an interlayer dielectric region; a source metal region; a first VIA region; and a drain metal region (not shown). In an embodiment, the first region comprises a first contact region. The device further comprises a VIA region. The first contact region (i.e., silicide contact) is on the eighth region and the fourth region. The device further comprises the second contact region on the sixth region. The second contact region comprises a plus region. The second contact region comprises a second conductivity type region (e.g., p-type). The second contact region and the body regions are of the same conductivity type (e.g., p-type). The device comprises the second VIA region.

Figure 25:
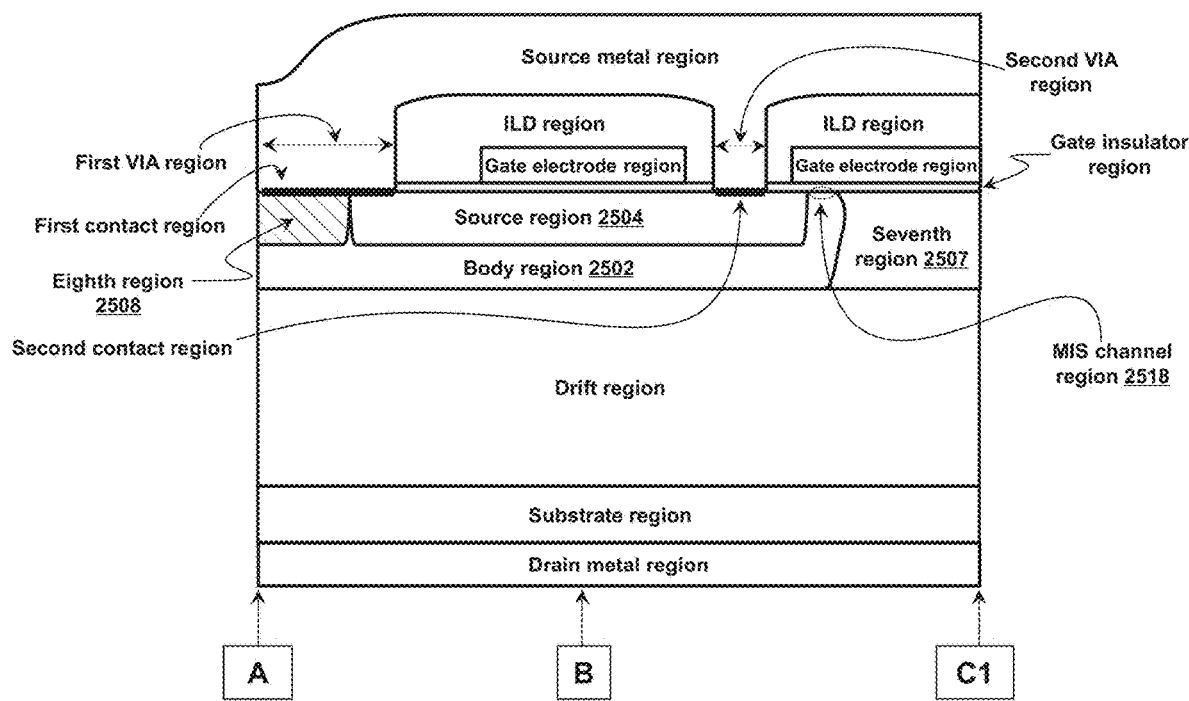
FIG. 25 shows an embodiment of a device depicting a cross section [A]-[C1], according to one or more embodiments.

FIG. 25 shows an embodiment of a device depicting a cross section [A]-[C1], according to one or more embodiments. The device shown in FIG. 25 is a metal oxide semiconductor field-effect transistor (MOSFET). The device comprises a body region 2502, a source region 2504 (i.e., a fourth region). The body region 2502 comprises a first region, a second region and a third region. The fourth region may comprise a fifth region and a sixth region (not shown). The source region is located on the body region 2502. The device comprises a MIS Channel region 2518 located between the fourth region and a seventh region. The MIS Channel region 2518 is located in the first region, the second region and the third region.

The seventh region 2507 is surrounded by the first region, the second region and the third region. The seventh region 2507 is between the successive body regions of the unit cell. The seventh region 2507 and the fourth region are of first conductivity type. The first conductivity type may be n-type. The device also comprises an eighth region 2508, a first VIA region, and a first contact region. The first contact region may be a silicide contact region. The first contact region forms an ohmic contact to both the eighth region 2508 and the fourth region. The first contact region is surrounded by the first VIA region. The device further comprises a second contact region and a second VIA region. The second contact region may be a plus region. The second contact region may be a second conductivity type region. The second contact region may be a p-plus region. The second contact region is surrounded by the second VIA region.

The device further comprises a drift region, a substrate region, a gate insulator region, a gate electrode region, an (ILD) interlayer dielectric region, a source metal region, and a drain metal region. The drift region may be of first conductivity type (e.g., n-type). The drift region may be n-drift region. The substrate region may be n+ substrate region. The gate insulator region may be a gate oxide layer. The gate electrode region may be a poly gate layer.

Figure 26:
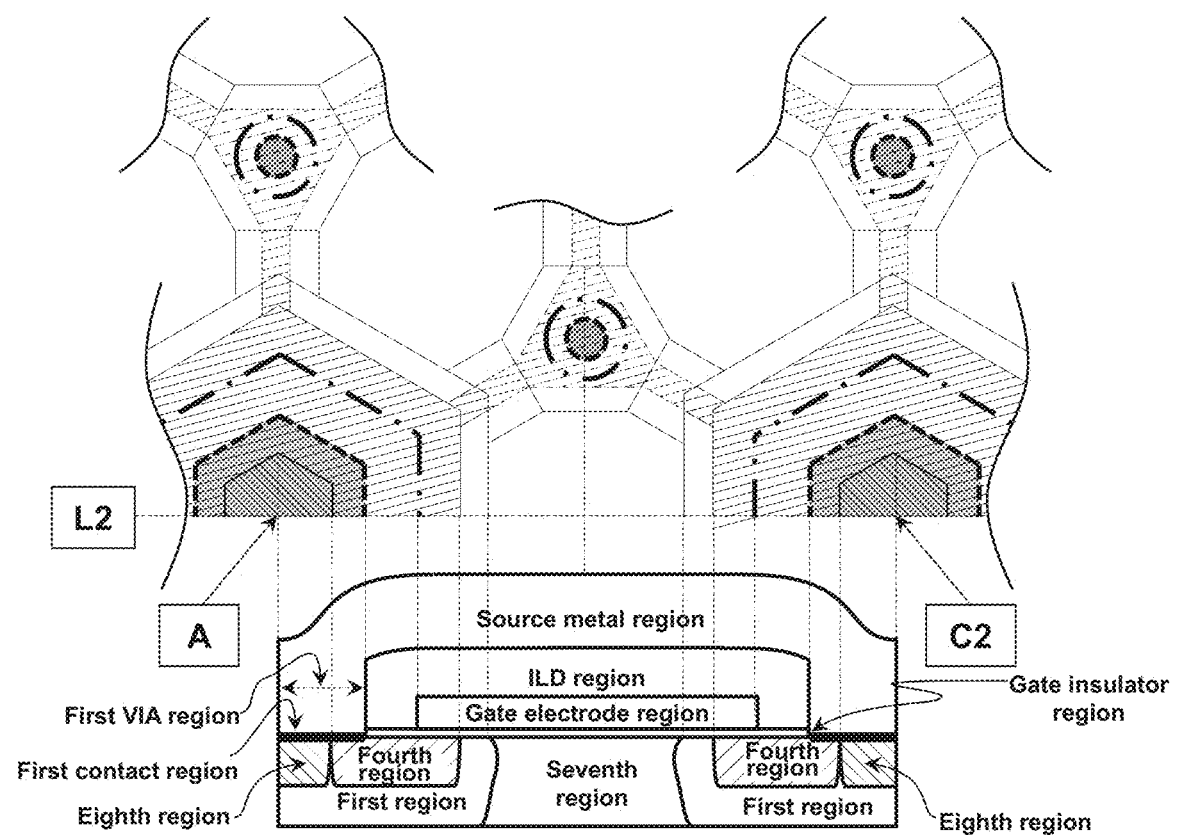
FIG. 26 and FIG. 27 illustrate a variation for the cross sections [A]-[C2], according to one or more embodiments.
Figure 27:
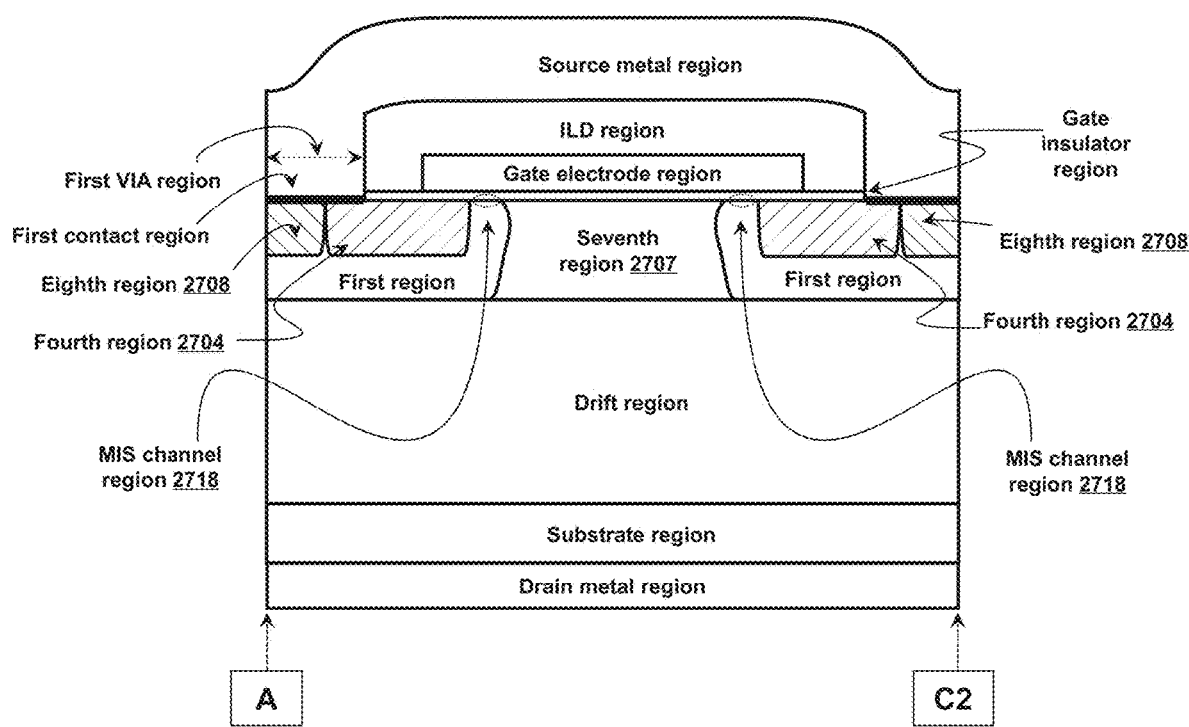

FIG. 26 and FIG. 27 illustrate a variation for the cross sections [A]-[C2], according to one or more embodiments. FIG. 26 depicts the schematic view of the device in connection with the cross sections to intelligibly illustrate the arrangements of the components within the device, according to one or more embodiments. FIG. 26 shows the device structure in vicinity of the SiC surface. FIG. 27 shows a schematic view according to a variation for the cross sections [A]-[C2]. The device comprises a seventh region 2707 between successive body regions. The device further comprises an eighth region 2708 adjacent to the fourth region 2704.

The device comprises a MIS Channel region 2718 between the fourth region 2704 and the seventh region 2707. The device comprises a first contact region and a first VIA region. The first contact region may be a silicide contact region. The first contact region forms an ohmic contact to both the eighth region 2708 and the fourth region 2704. The first contact region is surrounded by the first VIA region.

The device further comprises a drift region, a substrate region, a gate insulator region, a gate electrode region, an (ILD) interlayer dielectric region, a source metal region, and a drain metal region. The drift region may be of first conductivity type (e.g., n-type). The drift region may be n-drift region. The substrate region may be n+ substrate region. The gate insulator region may be a gate oxide layer. The gate electrode region may be a poly gate layer.

Figure 28:
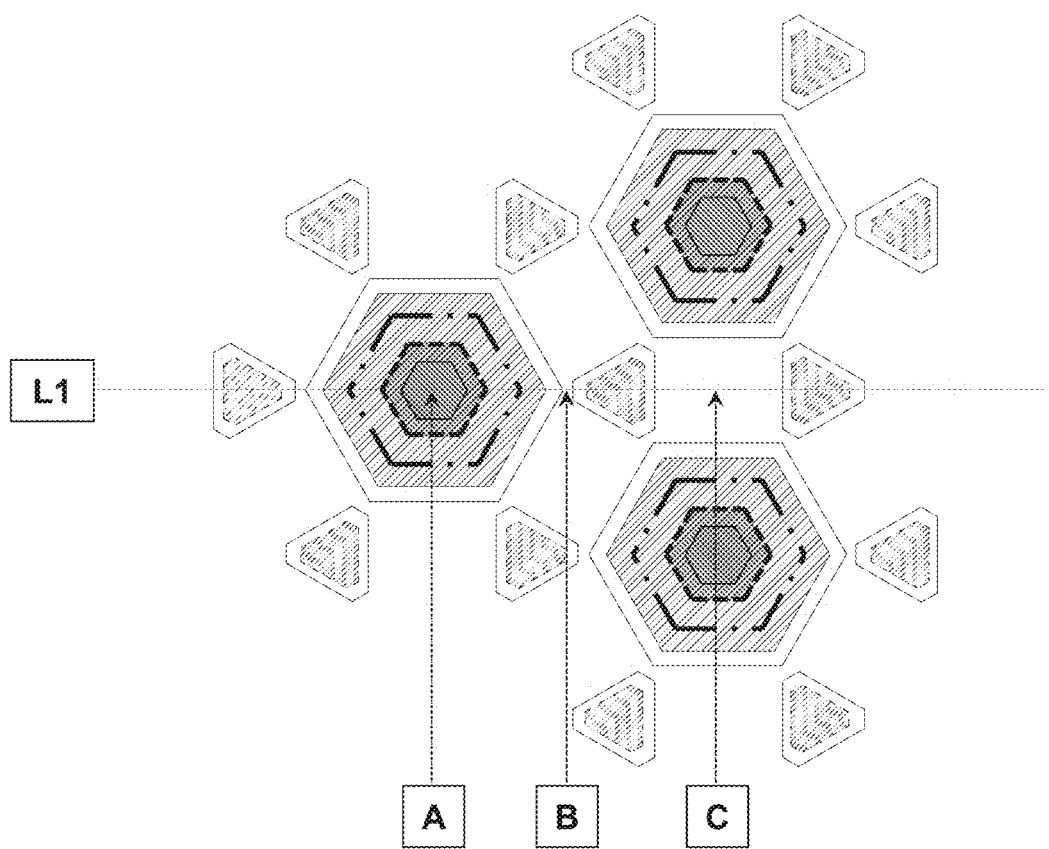
FIG. 28 illustrates an embodiment of a device having a sub-surface second region, according to one or more embodiments.
Figure 29:
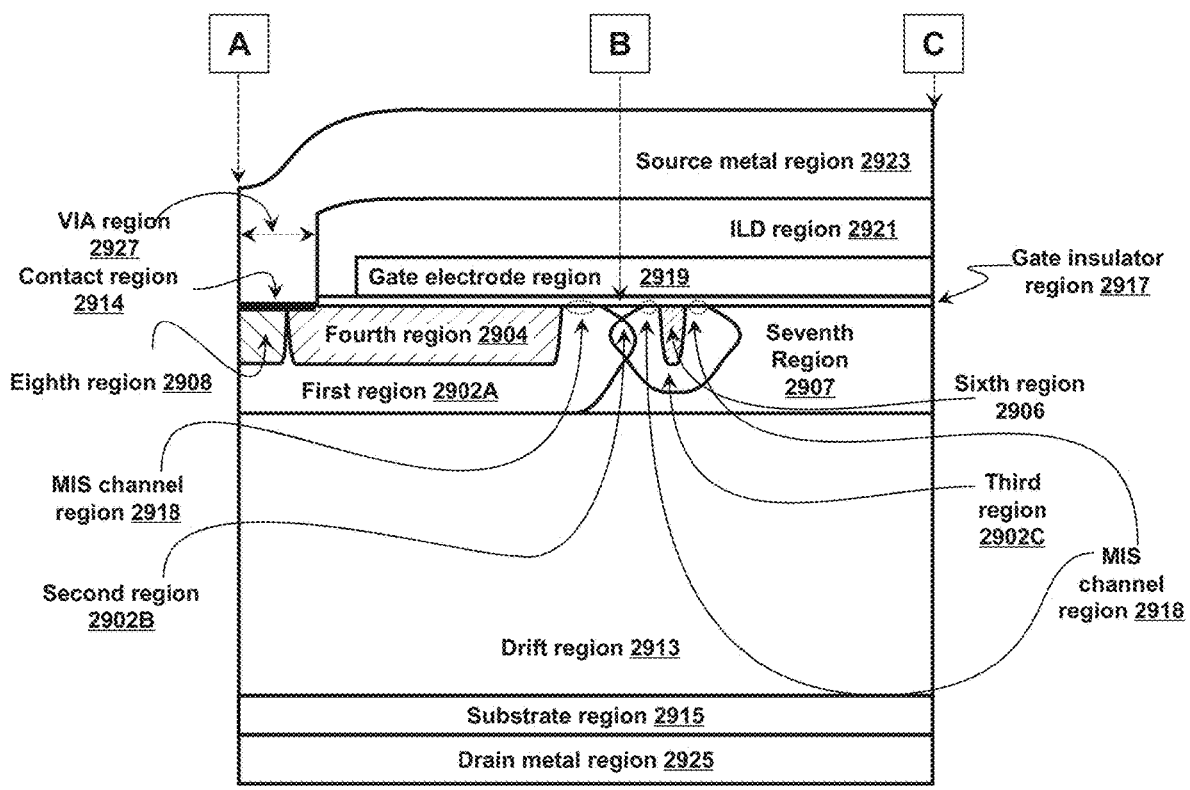
FIG. 29 illustrates a schematic view of a device showing reference points A, B and C, according to one or more embodiments.

FIG. 28 illustrates an embodiment of a device having a sub-surface second region, according to one or more embodiments. The device shown is a SiC MOSFET. FIG. 28 shows a top-down view of the device. The sub-surface second region is shown in FIG. 29. The device comprises a unit cell. The device comprises a body region. The unit cell comprises one or more semiconductor regions that are spatially arranged as a first region, a second region, a third region, a gate insulator region, and a fourth region residing on the first region and the third region. The first region, the second region and the third region constitute the body region. The first region comprises a first body region. The second region comprises a second body region. The third region comprises a third body region. The second region herein is a sub-surface second region. The second region is under the SiC surface of the device, i.e., the second region is not in contact with the gate insulator region. In an embodiment, the first region, the second region, and the third region are of same conductivity type. In an embodiment, the first region, the second region, and the third region are of a second conductivity type. In an embodiment, the second conductivity type is p-type. The one or more semiconductor regions comprises silicon carbide.

In an embodiment, the second region comprises laterally straggled ions from the first region and the third region. The ions from the first region and the third region move and merge into the sub-surface second region. The sub-surface second region is slightly below the surface of the first region and the third region. The first region and the third region are explicitly shown. The second region is not shown explicitly in the top-down view. The second region connects the first region and the third region with a periodicity. In an embodiment, a first end of the second region is contiguous with the first region and a second end of the second region is contiguous with the third region.

The device further comprises a fourth region. In an embodiment, the first region comprises a first contact region. In an embodiment, the fourth region comprises a second contact region laid on top of the first region. The fourth region further comprises a sixth region. The fourth region is onto (e.g., laid onto) the first region. The sixth region is onto (e.g., laid onto) the third region. In an embodiment, the fourth region and the sixth region are of a first conductivity type. The fourth region comprises the source region. Similarly, the sixth region comprises the source region. The source region does not exist in the second region (i.e., sub-surface second region). In an embodiment, the second region (i.e., sub-surface second region) connects the first region and the third region with a periodicity at a fixed interval space. In an embodiment, the second region connects the first region and the third region with a periodicity at an irregular interval space. In an embodiment, the first conductivity type is n-type. The subsurface nature of the second region enables promotion of the carrier spreading therefore reduces the conduction loss of the device. The subsurface nature concept provides necessary protection to the most vulnerable point from high electric field under the blocking mode of operation, while mitigating/improving the Rds(on) (in comparison to the prior art) by relaxing the JFET constraint around the surface-exposed third region due to the sub-surface nature of its second region.

In an embodiment, the sub-surface second region (e.g., sub-surface bridge (SSB) structure) is not explicitly formed by layout, rather it is formed by p-type ions that were laterally straggled from the first region and from the surface-exposed third region. The p-type ions laterally straggled from the two regions become merged together creating a permanent structure that physically connects the two regions underneath the SiC surface. Due to the sub-surface nature of the second region, a portion of the top of the n-type drift region that directly sits on top of the second region is kept as-is, which relaxes the JFET constraint at/near the SiC surface and promotes electron current spreading, reducing the Rds(on).

The distance between the first body region and the third region needs to be thoughtfully adjusted by considering the amounts of lateral straggling ions from both sides. The distance needs to be close enough so that the laterally straggled ions can meet and form the second region underneath the SiC surface. This puts an added constraint on the maximum distance between the first body region and the third region, which is in the range of 0.2~2.5 μm. The third portion of the SSB, whose Xj is shallower than or equal to the Xj of the first body region due to its smaller footprint, promotes the electron current spreading along the sidewall of and/or under the bottom of the third region due to further relaxation of the JFET constraint, reducing further the Rds(on).

The sub-surface second region of the SSB, which physically connects the first body region and the third region, allows sharing of the same electric potential across the two regions. In case the gate is biased as VGS>VTH, the inversion layers are formed at the SiC surfaces of the first body region and of the third region. The inversion layers formed on the two different p-type regions at the same time increases $Q_{gs}$ (gate-source charge) when compared to the NS (non-shield) type.

In an embodiment, the device further comprises a seventh region that surrounds the first region and the third region. In an embodiment, the seventh region and the fourth region are of same conductivity type. The device further comprises: a Metal-Insulator-Semiconductor (MIS) channel region. The MIS channel region is located on the first region. In an embodiment, the MIS channel region is located on the third region. In an embodiment, the MIS channel region is between the fourth region and a seventh region.

In an embodiment, the unit cell of the device further comprises: a drift region; a substrate region; a gate insulator region; a gate electrode region; an interlayer dielectric region; a source metal region; and a drain metal region. In an embodiment, the device further comprises: an eighth region; a trench region; a silicide region; and a VIA region. The eighth region is of a second conductivity type. In an embodiment, the eighth region is located below the trench region. The eighth region may comprise a contact region (e.g., p-plus region).

FIG. 29 illustrates a schematic view of a device showing reference points A, B and C, according to one or more embodiments. The device disclosed herein is a MOSFET. The device comprises a body region. The body region comprises a first region 2902A, a second region 2902B, and a third region 2902C. The first region 2902A comprises a first body region. The second region 2902B comprises a second body region. The third region 2902C comprises a third body region. The second region may be a sub-surface second region.

In an embodiment, the second region 2902B comprises laterally straggled ions from the first region 2902A and the third region 2902C. The ions from the first region 2902A and the third region 2902C move and merge into the sub-surface second region (i.e., the second region 2902B). The sub-surface second region (i.e., the second region 2902B) is slightly below the surface of the first region 2902A and the third region 2902C.

The unit cell of the device further comprises: a drift region 2913; a substrate region 2915; a gate insulator region 2917; a gate electrode region 2919; an interlayer dielectric region 2921; a source metal region 2923; and a drain metal region 2925. The device further comprises: an eighth region 2908; a contact region 2914; and a VIA region 2927. The eighth region 2908 is of a second conductivity type. The eighth region 2908 may comprise a p-plus region. The contact region 2914 may be a silicide region that is on the eighth region 2908 and the fourth region 2904.

The sub-surface second region (i.e., the second region 2902B) is not in contact with the gate insulator region 2917. The device comprises a fourth region 2904. The fourth region 2904 may be a source region. The fourth region 2904 is of first conductivity type. The fourth region 2904 comprises a sixth region 2906. The fourth region 2904 is located (laid onto) on the first region 2902A and the sixth region 2906 is located (laid onto) on the third region 2902C. The device further comprises a MIS channel region 2918. FIG. 29 depicts the MIS channel region 2918 located on the first region 2902A, and the third region 2902C. The MIS channel region 2918 is located between the first region 2902A and the fourth region 2904. The MIS channel region 2918 is further located between the third region 2902C and the sixth region 2906. The length of the MIS channel region 2918 is referred to as $L_{CH}$.

Figure 30:
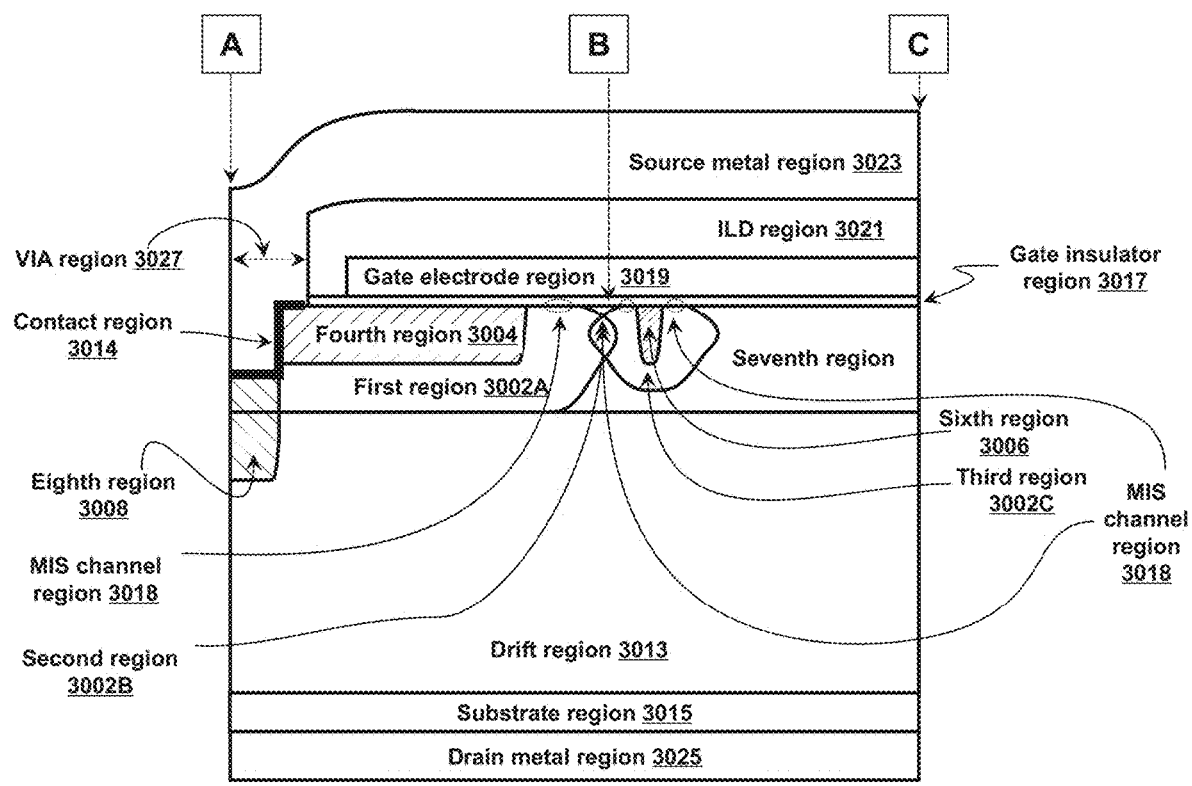
FIG. 30 illustrates a schematic view of a device shown in FIG. 29 having a SiC recessed region, according to one or more embodiments.

FIG. 30 illustrates a schematic view of a device shown in FIG. 29 having a SiC recessed region, according to one or more embodiments. The device comprises a contact region 3014 at the Sic recessed region. The contact region 3014 may be a silicide contact region located on the eighth region 3008 and the fourth region 3004. The eighth region 3008 is deeper than the first region 3002A. The eighth region 3008 is formed after the SiC recessed region which makes it deeper than the first region 3002A. The eighth region 3008 is of a second conductivity type. The eighth region 3008 may comprise a p-plus region. The contact region 3014 may be a silicide region that is on the eighth region 3008 and the fourth region 3004.

The unit cell of the device further comprises: a drift region 3013; a substrate region 3015; a gate insulator region 3017; a gate electrode region 3019; an interlayer dielectric region 3021; a source metal region 3023; and a drain metal region 3025. The device further comprises a VIA region 3027. The device further comprises other regions such as the MIS channel region 3018, seventh region as already described above.

The present disclosure may be embodied in other specific forms without departing from its spirit or characteristics. The described embodiments are to be considered in all respects only as illustrative and not restrictive. The scope is, therefore, indicated by the appended claims rather than by the foregoing description. All changes which come within the meaning and range of equivalency of the claims are to be embraced within their scope.

Other embodiments are also within the scope of the following claims.

Although various embodiments incorporate the teachings described in detail herein, those skilled in the art can readily devise many other varied embodiments that still incorporate these teachings. For example, a complementary SiC DMOS-FET device with a P+ substrate, P− drift layer and P+ source can be created in a N-well region (e.g., n type body region). The embodiments described are all applicable to the complementary DMOSFET as well.

All documents (patents, patent publications or other publications) mentioned in the specification are incorporated herein in their entirety by reference.

INCORPORATION BY REFERENCE

All publications, patents, and patent applications cited in this Specification are hereby incorporated by reference in their entirety, including:
U.S. Pat. No. 7,534,683B2 titled "Method of making a MOS-gated transistor with reduced miller capacitance";
U.S. Ser. No. 10/937,870B2 titled "Electric field shielding in silicon carbide metal-oxide-semiconductor (MOS) device cells using body region extensions"; and
U.S. Ser. No. 11/056,586B2 titled "Techniques for fabricating charge balanced (CB) trench-metal-oxide-semiconductor field-effect transistor (MOSFET) devices".

What is claimed is:
1. A device comprising:
a semiconductor unit cell, wherein the semiconductor unit cell comprises one or more semiconductor regions that are spatially arranged as:
a first region that comprises a first contact region,
a second region,
a third region,
a Metal-Insulator-Semiconductor (MIS) channel region;
a fourth region residing on the first region, and the third region, the fourth region that comprises
a fifth region, and
a sixth region,
wherein the one or more semiconductor regions comprises silicon carbide;
wherein the fourth region, the fifth region, and the sixth region are of same conductivity type;
wherein the fifth region and the sixth region are shallower than the fourth region;
wherein the second region connects the first region and the third region;
wherein the first region, the second region and the third region are of same conductivity type;
wherein the MIS channel region is located on at least one of the first region, the second region, and the third region; and
wherein the first contact region is formed on the first region.
2. The device of claim 1, wherein the second region connects the first region and the third region with a periodicity at a fixed interval space.
3. The device of claim 1, further comprising:
a seventh region that is surrounded by the first region, the second region and the third region,
wherein the seventh region and the fourth region are of same conductivity type.
4. The device of claim 3, wherein the fourth region and the seventh region are of a first conductivity type.
5. The device of claim 1, wherein the first region, the second region, and the third region are of a second conductivity type.
6. The device of claim 1, wherein the fourth region, the fifth region, and the sixth region are of a first conductivity type.
7. The device of claim 1, wherein the fourth region is on the first region.
8. The device of claim 1, wherein the fifth region is on the second region.
9. The device of claim 1, wherein the sixth region is on the third region.
10. The device of claim 1, wherein the device further comprising:
an eighth region, wherein the eighth region is of a second conductivity type.
11. The device of claim 1, further comprising a second contact region, wherein the second contact region is formed on the sixth region.

12. A device comprising:
a semiconductor unit cell, wherein the semiconductor unit cell comprises one or more semiconductor regions that are spatially arranged as:
  a first region that comprises a first contact region,
  a second region,
  a third region,
  a fourth region residing on the first region, and the third region; and
  a seventh region that is surrounded by the first region, the second region and the third region,
  wherein the second region connects the first region, and the third region;
  wherein the first region, the second region, and the third region are of same conductivity type; and
  wherein the first contact region is formed on the first region;
  wherein the seventh region and the fourth region are of same conductivity type; and
  wherein the seventh region comprises a plurality of depletion paths that extends inwards from a plurality of directions from the first region, the second region, and the third region towards a center of the seventh region.

13. The device of claim 12, wherein the seventh region comprises a first dimension and a second dimension, wherein a ratio of the first dimension to the second dimension is in a range from 0.3 to 2.0.

14. The device of claim 12, further comprising
  a gate insulator region;
wherein the second region is not in contact with the gate insulator region.

15. The device of claim 14, wherein the second region comprises laterally straggled ions from the first region and the third region.

16. The device of claim 14, further comprising an eighth region located below a trench region.

17. The device of claim 12, wherein the fourth region is also residing on the second region.

* * * * *